United States Patent
Zhu et al.

(10) Patent No.: US 10,109,638 B1
(45) Date of Patent: Oct. 23, 2018

(54) EMBEDDED NON-VOLATILE MEMORY (NVM) ON FULLY DEPLETED SILICON-ON-INSULATOR (FD-SOI) SUBSTRATE

(71) Applicant: GLOBALFOUNDRIES Singapore Pte. Ltd., Singapore (SG)

(72) Inventors: Ming Zhu, Singapore (SG); Pinghui Li, Singapore (SG); Danny Shum, Singapore (SG); Fan Zhang, Singapore (SG); Yiang Aun Nga, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/790,080

(22) Filed: Oct. 23, 2017

(51) Int. Cl.
| H01L 27/115 | (2017.01) |
| H01L 27/11531 | (2017.01) |
| H01L 27/11524 | (2017.01) |
| H01L 29/78 | (2006.01) |
| H01L 27/12 | (2006.01) |
| H01L 23/66 | (2006.01) |
| H01L 27/11529 | (2017.01) |

(52) U.S. Cl.
CPC ........ H01L 27/11531 (2013.01); H01L 23/66 (2013.01); H01L 27/11524 (2013.01); H01L 27/11529 (2013.01); H01L 27/1207 (2013.01); H01L 29/7838 (2013.01)

(58) Field of Classification Search
CPC ......... H01L 27/11531; H01L 27/11529; H01L 23/66; H01L 29/7838; H01L 27/11524; H01L 27/1207
See application file for complete search history.

(56) References Cited

U.S. PATENT DOCUMENTS

| 6,140,163 A * | 10/2000 | Gardner | H01L 21/8221 257/347 |
| 6,906,384 B2 * | 6/2005 | Yamada | H01L 21/76243 257/202 |
| 7,145,215 B2 * | 12/2006 | Inoh | H01L 21/76283 257/522 |
| 7,274,073 B2 * | 9/2007 | Anderson | H01L 21/76275 257/347 |
| 7,323,748 B2 * | 1/2008 | Yamada | H01L 29/7841 257/347 |
| 7,439,112 B2 * | 10/2008 | Nagano | H01L 21/76251 257/E21.008 |

(Continued)

*Primary Examiner* — Earl Taylor
(74) *Attorney, Agent, or Firm* — Horizon IP Pte Ltd.

(57) ABSTRACT

A semiconductor device with embedded non-volatile memory (eNVM) is described. The device is formed on a silicon-on-insulator (SOI) substrate, such as a fully depleted SOI (FDSOI) substrate. The substrate includes a SOI region and a hybrid region. The SOI region includes the surface substrate, BOX and bulk substrate while the hybrid region includes only the bulk substrate. NVM and high voltage (HV) transistors are disposed in the hybrid region while a logic and radio frequency (RF) transistors are disposed in the SOI region. The gates of the various transistors have about coplanar top surfaces. As such, the hybrid region compensates for height differential of transistors, enabling transistors to have about coplanar top surfaces. In addition, the hybrid region enables transistors which suffer from floating body effects to be disposed therein.

20 Claims, 17 Drawing Sheets

(56) References Cited

U.S. PATENT DOCUMENTS

| | | | | |
|---|---|---|---|---|
| 7,510,945 | B2* | 3/2009 | Nagano | H01L 21/76251 |
| | | | | 438/406 |
| 7,687,857 | B2* | 3/2010 | Tang | H01L 21/823412 |
| | | | | 257/353 |
| 7,759,255 | B2* | 7/2010 | Hamamoto | H01L 21/84 |
| | | | | 257/E21.546 |
| 7,955,937 | B2* | 6/2011 | Wieczorek | H01L 21/76243 |
| | | | | 257/347 |
| 7,968,944 | B2* | 6/2011 | Joshi | H01L 21/84 |
| | | | | 257/350 |
| 8,395,216 | B2* | 3/2013 | Owens | H01L 21/76283 |
| | | | | 257/350 |
| 9,659,948 | B2* | 5/2017 | Hsu | H01L 27/11529 |
| 2003/0119228 | A1* | 6/2003 | Oyamatsu | H01L 21/76264 |
| | | | | 438/149 |
| 2003/0151112 | A1* | 8/2003 | Yamada | H01L 21/76243 |
| | | | | 257/510 |
| 2006/0231893 | A1* | 10/2006 | Bernstein | H01L 21/823807 |
| | | | | 257/347 |
| 2006/0231899 | A1* | 10/2006 | Chang | G11C 11/412 |
| | | | | 257/368 |
| 2007/0215943 | A1* | 9/2007 | Hamamoto | H01L 21/84 |
| | | | | 257/347 |
| 2012/0129301 | A1* | 5/2012 | Or-Bach | H01L 21/6835 |
| | | | | 438/129 |
| 2016/0211250 | A1* | 7/2016 | Langheinrich | H01L 27/11534 |
| 2016/0225819 | A1* | 8/2016 | Toh | H01L 27/228 |
| 2017/0084622 | A1* | 3/2017 | Hsu | H01L 27/11529 |
| 2017/0221913 | A1* | 8/2017 | Hsu | H01L 27/11521 |
| 2017/0271325 | A1* | 9/2017 | Weber | H01L 27/0623 |
| 2017/0373074 | A1* | 12/2017 | Liu | H01L 27/11206 |

* cited by examiner

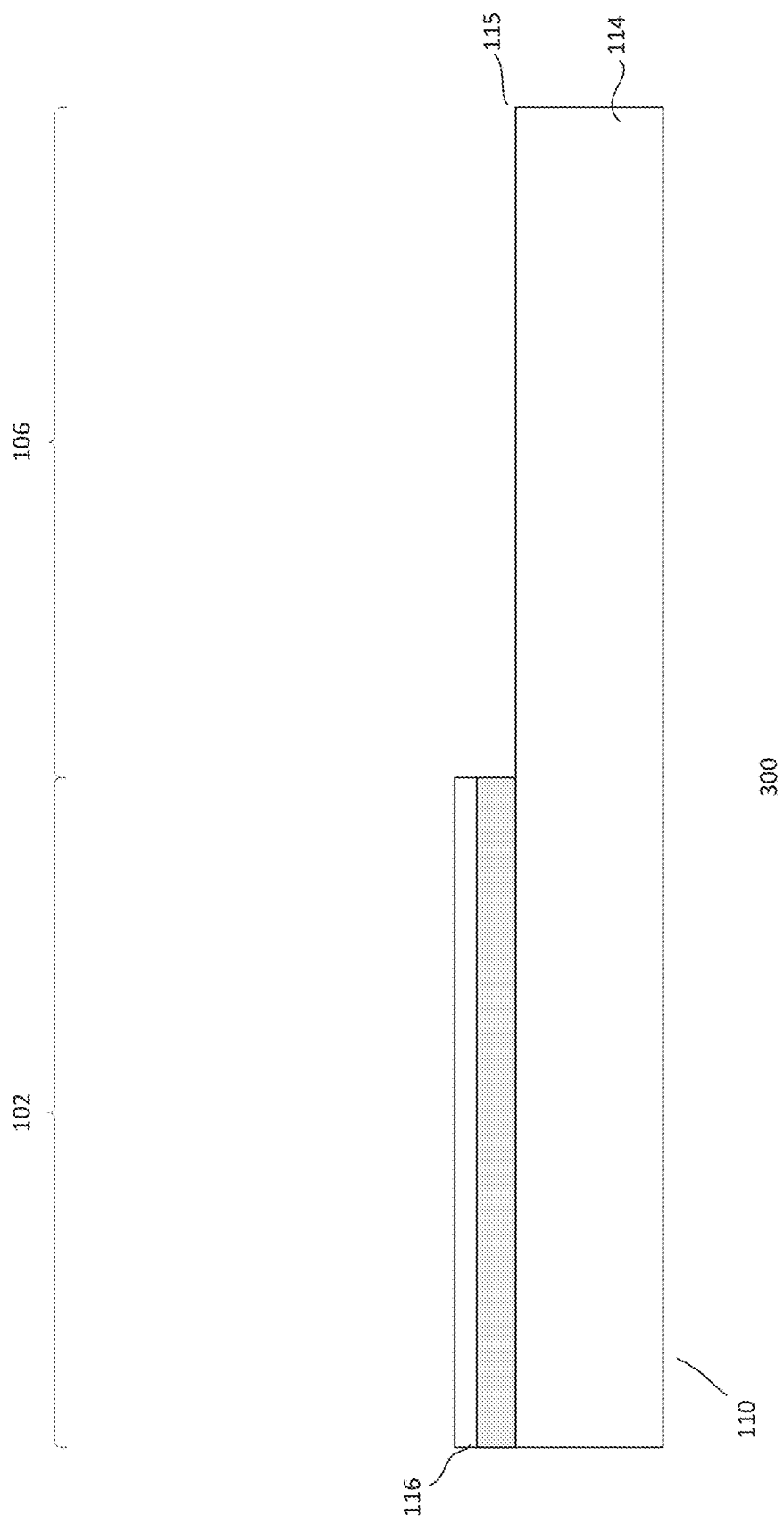

EMBEDDED NON-VOLATILE MEMORY (NVM) ON FULLY DEPLETED SILICON-ON-INSULATOR (FD-SOI) SUBSTRATE

BACKGROUND

Non-volatile memory (NVM) devices are memory devices that retain or store data even when power is off. Non-volatile memory devices, for example, include flash devices which can be programmed using electrical signals. It is desirable to embed NVM devices with logic devices, such as metal-oxide semiconductor (MOS) devices, to form embedded NVM (eNVM) devices. Conventional eNVM devices have various issues, such as different gate heights between NVM cells and logic devices. The different gate heights create processing complexity in forming eNVM devices. For example, different gate heights create problems in forming contact landings. In addition, logic devices, such as high voltage MOS (HVMOS) devices, are incompatible with silicon-on-insulator (SOI) substrates due to intrinsic floating body effect, negatively impacting the performance of the devices.

The present disclosure is directed to providing reliable and high performing eNVM devices which can be easily manufactured.

SUMMARY

Embodiments of the present disclosure generally related to a reliable and high performing NVM device. In one embodiment, a method of fabricating a semiconductor device. The method includes providing a substrate having a crystal-on-insulator (COI) substrate. The COI substrate includes a surface substrate, a bulk substrate, and a buried oxide (BOX) disposed between the surface and bulk substrates. A COI region is defined on the substrate, wherein the COI region of the substrate includes the surface substrate, the BOX and the bulk substrate. A hybrid region is further defined on the substrate, wherein defining the hybrid region includes removing the surface substrate in the hybrid region and removing the BOX in the hybrid region to expose the bulk substrate. A non-volatile memory (NVM) transistor is formed in a NVM region defined in the hybrid region of the substrate. The NVM transistor includes a NVM gate on the bulk substrate between first and second NVM source/drain (S/D) regions. A logic transistor is formed in a logic region defined in the COI region of the substrate. The logic transistor includes a logic gate on the surface substrate between first and second logic S/D regions. In addition, forming the NVM and logic transistors include forming the NVM gate and logic gate having about coplanar top NVM and logic gate surfaces.

In another embodiment, a semiconductor device is disclosed. The device includes a substrate having a crystal-on-insulator (COI) substrate. The COI substrate includes a surface substrate, a bulk substrate, and a buried oxide (BOX) disposed between the surface and bulk substrates. The device further includes a COI region on the substrate, wherein the COI region of the substrate includes the surface substrate, the BOX and the bulk substrate. The device further includes a hybrid region on the substrate, wherein the hybrid region comprises the bulk substrate without the surface substrate and BOX. The device further includes a non-volatile memory (NVM) transistor in a NVM region defined in the hybrid region of the substrate. The NVM transistor includes a NVM gate on the bulk substrate between first and second NVM source/drain (S/D) regions. The device further includes a logic transistor in a logic region defined in the COI region of the substrate. The logic transistor includes a logic gate on the surface substrate between first and second logic S/D regions. In addition, the NVM gate and the logic gate have about coplanar top NVM and logic gate surfaces.

In yet another embodiment, a method for fabricating a semiconductor device is presented. The method includes providing a substrate having a crystal-on-insulator (COI) substrate. The COI substrate includes a surface substrate, a bulk substrate, and a buried oxide (BOX) disposed between the surface and bulk substrates. A COI region is defined on the substrate, wherein the COI region of the substrate includes the surface substrate, the BOX and the bulk substrate. A hybrid region is further defined on the substrate, wherein defining the hybrid region includes removing the surface substrate in the hybrid region and removing the BOX in the hybrid region to expose the bulk substrate. A hybrid transistor is formed in a secondary hybrid device region in the hybrid region of the substrate, wherein the hybrid device includes a hybrid gate between first and second hybrid S/D regions. A COI transistor is formed in a secondary COI region defined in the COI region of the substrate, the COI transistor includes a COI gate between first and second logic COI S/D regions. The hybrid and COI gates include about coplanar top hybrid and COI gate surfaces.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure. In the following description, various embodiments of the present invention are described with reference to the following:

FIGS. 3a-3k show cross-sectional views of a process for forming an embodiment of an eNVM device.

DETAILED DESCRIPTION

Embodiments generally relate to semiconductor devices. More particularly, the present disclosure generally relates to eNVM devices. The eNVM devices, in one embodiment, are formed on a fully depleted silicon-on-insulator (FD-SOI) substrate. The eNVM devices, in one embodiment, include eNVM devices embedded with various types of devices, such logic devices, radio frequency (RF) devices and high voltage (HV) devices. The eNVM devices may be incorporated into various types of electronic products.

Figure 1:
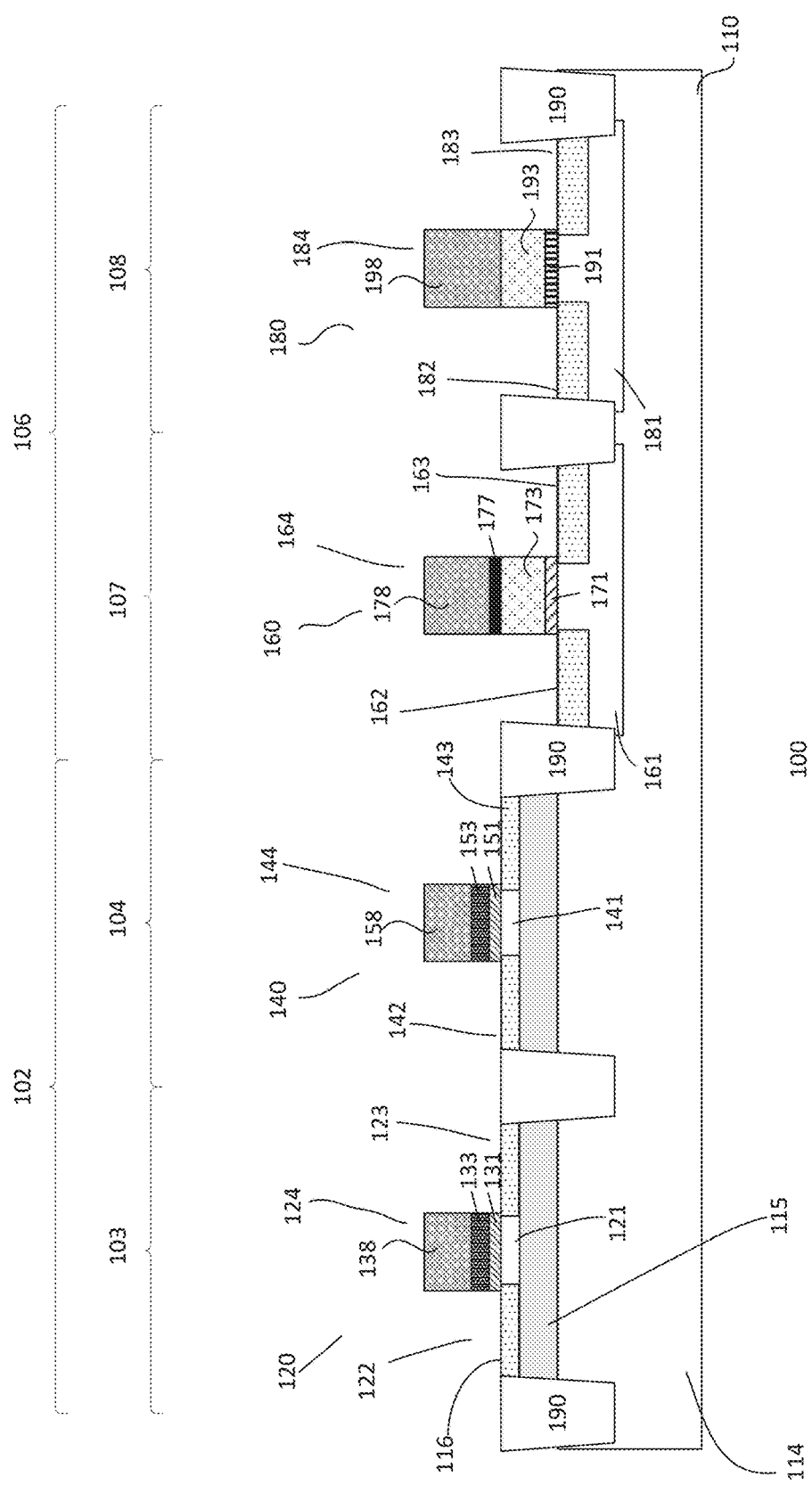
FIG. 1 shows a cross-sectional view of an embodiment of an eNVM device.

FIG. 1 shows an embodiment of an eNVM device 100. As shown, the eNVM device includes a substrate 110. The substrate may be a crystal-on-insulator (COI) substrate. A COI substrate includes a surface crystalline substrate 116, a bulk crystalline substrate 114 separated by a buried oxide (BOX) layer 115. The COI substrate, for example, may be a silicon-on-insulator (SOI) substrate in which the surface and bulk substrates are silicon substrates. In one embodiment, the SOI substrate is a fully depleted SOI (FDSOI) substrate. Other types of COI substrates may also be useful. For the FDSOI substrate, the surface substrate may have a thickness of about 5 nm while the BOX layer is about 20 nm. As for the bulk substrate, it may be about 500-1000 μm thick. Other thicknesses may also be useful. The surface and bulk substrates may be doped substrates. For example, the surface and bulk substrates may be lightly doped p-type substrates. Other types of doped substrates, including undoped substrates, may also be useful.

The substrate includes first and second main device regions 102 and 106. As shown, the first main region is a COI region, such as a SOI region, which includes the surface substrate, the BOX and the bulk substrate. The second main region is a hybrid region which includes only the bulk substrate. The first main region or SOI region includes first or SOI secondary regions and the second main or hybrid region includes second or hybrid secondary regions. Illustratively, the SOI second device regions include first and second SOI secondary device regions 103 and 104 while the hybrid region includes first and second hybrid secondary device regions 107 and 108. Providing other types of secondary device regions for the SOI and hybrid device regions may also be useful.

The substrate includes isolation regions 190 to isolate the different regions. For example, the isolation regions isolate the device regions from other device regions, as required. An isolation region may be configured to surround a device region. The isolation regions, for example, are shallow trench isolation (STI) regions. A STI region includes a trench filled with dielectric isolation material, such as silicon oxide. Other types of isolation regions are also useful. As shown, the STI regions have sufficient depth to provide isolation for device regions in the hybrid device regions. Further as shown, the isolation regions have about the same height. Slight variations may occur due to process variations. In one embodiment, the isolation regions in the SOI regions have a coplanar top surface with the surface substrate while the isolation regions in the hybrid regions protrude above the surface of the bulk substrate.

The first SOI secondary region may serve as a logic region which includes a logic transistor 120. The logic transistor, for example, is a metal oxide semiconductor (MOS) transistor. The logic transistor includes a logic gate 124 disposed between first and second logic S/D regions 122 and 123 on the surface substrate. The logic gate includes a gate dielectric 131 below a gate electrode. In one embodiment, the logic gate includes first and second gate electrodes 133 and 138 disposed over the gate dielectric. The gate dielectric may be a high k gate dielectric, such as hafnium oxide (HfO$_2$). The first gate electrode may be a metal gate, such as titanium nitride (TiN), and the second gate electrode may be a polysilicon gate electrode, such as a doped polysilicon gate electrode. The thickness of the gate dielectric may be about 15 angstrom, the thickness of the metal gate electrode may be about 30 angstrom and the thickness of the polysilicon gate electrode may be about 25 nm. Other types of or thicknesses for the various gate layers may also be useful.

The first and second logic S/D regions 122 and 123 are doped logic S/D regions in the surface substrate. In one embodiment, the doped logic S/D regions are heavily doped logic S/D regions with first polarity type dopants. The logic S/D regions are disposed in a logic well 121 in the surface substrate. The logic well may be a lightly or intermediately doped logic well with second polarity type dopants for a first polarity type logic transistor. For example, a p-type logic well serves as a body for a n-type logic transistor. Providing a n-type logic well for a p-type logic transistor may also be useful. A channel of the logic transistor is disposed in the surface substrate below the logic gate between the logic S/D regions.

The second SOI secondary region may serve as a radio frequency (RF) region which includes a RF transistor 140. The RF transistor, for example, is a RF metal oxide semiconductor (RFMOS) transistor. The RF transistor includes a RF gate 144 disposed between first and second RF S/D regions 142 and 143 on the surface substrate. The RF gate may be similar to the logic gate. For example, the RF gate includes a high k gate dielectric 151 and a gate electrode which includes a metal gate electrode 153 below a polysilicon gate electrode 158. The RF gate and logic gate, as shown, have about the same height. Variation in heights may be due to process variations. The height, for example, is relative to the top of the surface substrate. The top of the logic and RF gates may be about coplanar.

The first and second RF S/D regions 142 and 143 are doped RF S/D regions in the surface substrate. In one embodiment, the doped RF S/D regions are heavily doped RF S/D regions with first polarity type dopants. The RF S/D regions are disposed in a RF well 141 in the surface substrate. The RF well may be a lightly or intermediately doped RF well doped with second polarity type dopants for a first polarity type RF transistor. For example, a p-type RF well serves as a body for a n-type RF transistor. Providing a n-type RF well for a p-type RF transistor may also be useful. A channel of the RF transistor is disposed in the surface substrate below the RF gate between the RF S/D regions.

As for the first hybrid secondary device region 107, it may serve as a memory region. The memory region includes a non-volatile memory (NVM) cell. The NVM cell may be a flash NVM cell. In one embodiment, the memory cell includes a memory transistor 160. The NVM transistor, for example, is a NVM MOS transistor. The NVM transistor includes a NVM gate 164 disposed between first and second NVM S/D regions 162 and 163 on the bulk substrate. In one embodiment, the NVM gate includes a stacked gate with a first NVM gate disposed below a second NVM gate. For example, the NVM gate includes a second NVM gate stacked over the first NVM gate. The first NVM gate includes a first NVM gate electrode 173 disposed over a first NVM gate dielectric 171. The second NVM gate includes a second NVM gate electrode 178 disposed over a first NVM gate dielectric 177.

The first gate may serve as a floating gate (FG) with a FG electrode over a FG dielectric. The FG dielectric serves as a tunnelling dielectric. In one embodiment, FG dielectric may be a silicon oxide FG dielectric, such as a thermal oxide FG dielectric. The thickness of the FG dielectric may be about 5 nm. As for the FG electrode, it may be a polysilicon FG electrode. The thickness of the FG electrode may be about 20 nm. Other types of or thicknesses for the FG dielectric and electrode may also be useful.

The second gate may serve as a control gate (CG) with a CG electrode over a CG dielectric. The CG dielectric serves as a charge trapping dielectric. The charge trapping dielectric may be a charge trapping dielectric stack with multiple CG dielectric layers. In one embodiment, CG dielectric may be an oxide/nitride/oxide (ONO) stack. The thickness of the CG dielectric may be about 10 nm. As for the CG electrode, it may be a polysilicon CG electrode. The thickness of the CG electrode may be about 25 nm. Other types of or thicknesses for the CG dielectric and electrode may also be useful.

As shown, a top of the FG is about coplanar with a top surface of the surface substrate. For example, the FG extends from the surface of the bulk substrate to a height which is about coplanar with a top surface of the surface substrate in the SOI region. The CG which is over the FG has a top surface that is coplanar with about the top surface of the SOI gates. It is understood that there may be slight variation in heights due to, for example, process variations.

The first and second NVM S/D regions 162 and 163 are doped NVM S/D regions in the bulk substrate. In one embodiment, the NVM S/D regions are heavily doped S/D regions with first polarity type dopants. The S/D regions are disposed in a NVM well 161 in the bulk substrate. The NVM well may be a lightly or intermediately doped logic well doped with second polarity type dopants for a first polarity type NVM transistor. For example, a p-type NVM well serves as a body for a n-type NVM transistor. Providing a n-type NVM well for a p-type NVM transistor may also be useful. A channel of the NVM transistor is disposed in the bulk substrate below the NVM gate between the NVM S/D regions.

The second hybrid secondary device region 108 may serve as a high voltage (HV) region with a HV transistor 180. The HV transistor, for example, is a HV MOS transistor. The HV transistor includes a HV gate 184 disposed between first and second HV S/D regions 182 and 183 on the bulk substrate.

The HV gate includes a HV gate dielectric 191 below a gate electrode. In one embodiment, the gate includes first and second HV gate electrodes 193 and 198 disposed over the gate dielectric. The HV gate dielectric may be a silicon oxide gate dielectric, such thermal oxide and first and second HV gate electrodes may be polysilicon gate electrodes, such as doped polysilicon gate electrodes. The thickness of the HV gate dielectric may be about 10 nm, the thickness of the first HV gate electrode may be about 15 nm and the thickness of the second gate electrode may be about 25 nm. Other types of or thicknesses for the various gate layers may also be useful.

As shown, a top of the first HV gate electrode is about coplanar with a top surface of the surface substrate. For example, the first HV gate electrode extends from the HV gate dielectric to a height which is about coplanar with a top surface of the surface substrate in the SOI region. The second HV gate electrode has a top surface which is about coplanar with the NVM gate and the SOI gates. It is understood that there may be slight variation in heights due to, for example, process variations.

The first and second HV S/D regions 182 and 183 are doped HV S/D regions in the bulk substrate. In one embodiment, the HV S/D regions are heavily doped S/D regions with first polarity type dopants. The S/D regions are disposed in a HV well 181 in the bulk substrate. The HV well may be a lightly or intermediately doped HV well doped with second polarity type dopants for a first polarity type HV transistor. For example, a p-type HV well serves as a body for a n-type HV transistor. Providing a n-type HV well for a p-type HV transistor may also be useful. A channel of the HV transistor is disposed in the bulk substrate below the HV gate between the HV S/D regions.

The gates of the various transistors may include dielectric sidewall spacers. The spacers may facilitate in forming lightly doped extension regions in the S/D regions. For example, S/D regions may include extension regions which extend slightly under the gate while the heavily doped portion of the S/D region is aligned with the spacers. Other configurations of the gates and S/D regions may also be useful. The gates of the transistors, for example, are gate first gates. Gate first gates are formed prior to forming the S/D regions. In addition, the device may include a back-end-of-line (BEOL) dielectric (not shown) which includes multiple interconnect levels with metal interconnects and via contacts for interconnecting the different transistors and components of the device.

As described, the device includes four different regions for purpose of simplification. It is understood that the device may include numerous device regions. For example, in the case of the NVM region, it may include numerous NVM regions for NVM transistors or cells of a NVM array. The NVM gates may be NVM gate electrodes forming rows of memory cells with a common NVM gate. In addition, device regions may be provided for second polarity type devices to provide complementary MOS transistors. Other types of device regions may also be included.

As also described, various types of transistors are integrated on a substrate, such as a FDSOI substrate. By providing both SOI and hybrid regions on the substrate, devices can be located in the SOI region to take advantage of buried oxide (BOX) while other devices which suffer from floating body effects can be located in the hybrid regions. In addition, to avoid differences in gate height, transistors with higher gate height are located in the hybrid region. The hybrid region may compensate for the differences in gate heights, resulting in transistors of the device having coplanar top surfaces.

Figure 2:
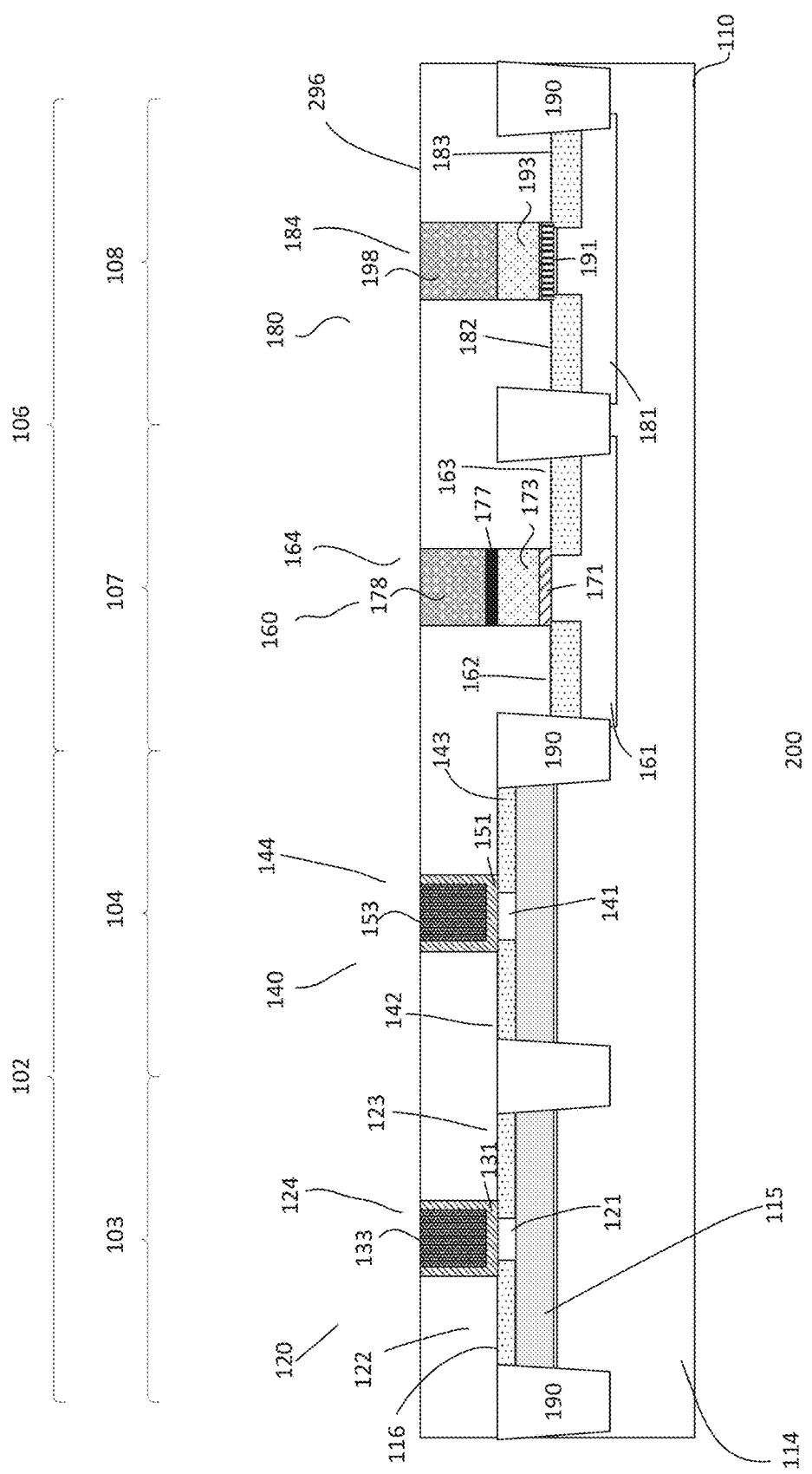
FIG. 2 shows a cross-sectional view of another embodiment of an eNVM device.

FIG. 2 shows a cross-sectional view of another embodiment of a device 200. The device is similar to that described in FIG. 1. Common elements may not be described or described in detail. The device includes a substrate 110 with SOI and hybrid regions 102 and 106. The SOI region may include a logic region 103 with a logic transistor 120 and a RF region 104 with a RF transistor 140 while the hybrid region may include a NVM region 107 with a NVM transistor 160 and a HV region 108 with a HV transistor 180.

The device includes a dielectric layer 296 disposed on the substrate. The dielectric layer, for example, is a silicon oxide layer. Other types of dielectric layers may also be useful. The dielectric layer and top surfaces of the different gates in the SOI and hybrid regions are coplanar.

In one embodiment, the gates of the transistors in the SOI regions are gate last gates. For example, the gates of the SOI transistors are formed after forming the S/D regions. For the gates of the transistors in the hybrid regions are gate first gates. For example, the gates of the transistors in the hybrid regions are formed prior to forming the S/D regions. A gate last gate includes a gate dielectric layer. The gate dielectric layer of a gate last gate is disposed on the sidewalls of the gate and under the gate. For example, a high k logic gate dielectric 131 is disposed on sidewalls and bottom of a metal logic gate 133. Similarly, a high k RF gate dielectric 151 is disposed on sidewalls and bottom of a metal RF gate 153. Unlike the gate first gates in the hybrid region which include both metal gate and polysilicon gate electrodes, the gate last gates in the SOI region only include metal gate electrodes.

FIGS. 3a-3k show cross-sectional views of an embodiment of a process 300 for forming a device. The device, for example, is similar to that described in FIGS. 1-2. Common elements may not be described or described in detail.

Figure 3A:
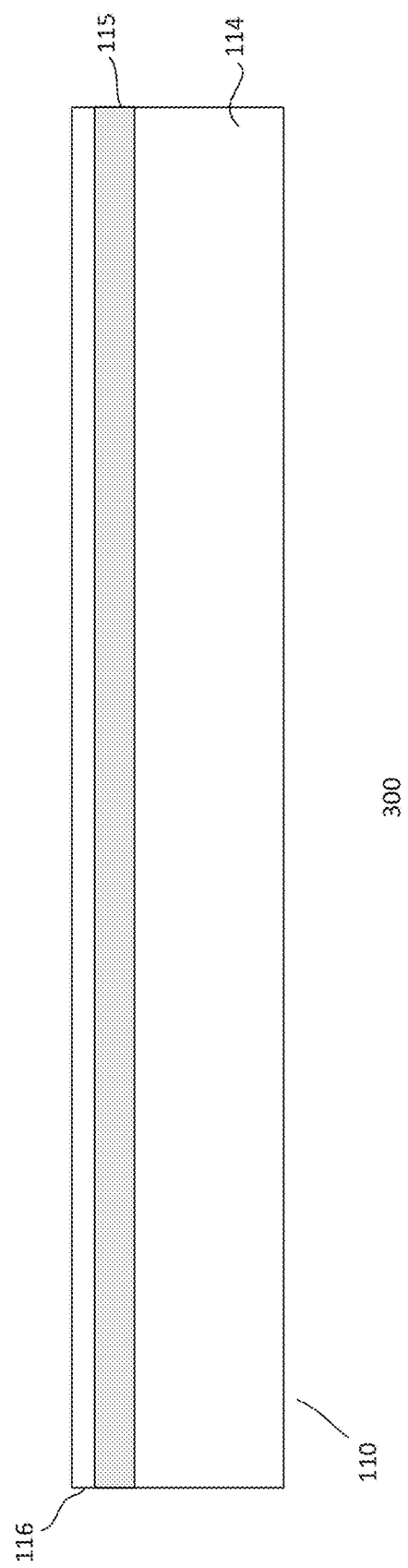

Referring to FIG. 3a, a substrate 110 is provided. The substrate may be a crystal-on-insulator (COI) substrate. A COI substrate includes a surface crystalline substrate 116, a bulk crystalline substrate 114 separated by a buried oxide (BOX) layer 115. The COI substrate, for example, may be a silicon-on-insulator (SOI) substrate in which the surface and bulk substrates are silicon substrates. In one embodiment, the SOI substrate is a fully depleted SOI (FDSOI) substrate. Other types of COI substrates may also be useful.

In FIG. 3b, the substrate is processed to define first and second main device regions 102 and 106. The first main device region may be a COI region, such as a SOI region and the second main region is a hybrid region. The first and second main device regions may be defined using mask and etch techniques. For example, an etch mask, such as photoresist mask, is provided on the substrate surface. An antireflective coating (ARC) may be provided below the etch mask to improve lithographic resolution. The etch mask may be exposed with an exposure source using a reticle having a desired pattern. The pattern of the reticle is transferred to the etch mask after exposure and development. For example, the etch mask includes a pattern which exposes the region of the substrate to be etched or removed. An etch, such as a reactive ion etch (RIE) may etch the substrate using the etch mask, removing exposed portions of the substrate. In one embodiment, the etch mask exposes the hybrid region. The etch removes the surface substrate and BOX in the hybrid region, exposing the bulk substrate in the hybrid region. The surface substrate and BOX remain protected by the etch mask in the SOI region. After defining the first and second main device regions, the etch mask is removed. The etch mask may be removed by, for example, ashing.

Figure 3C:
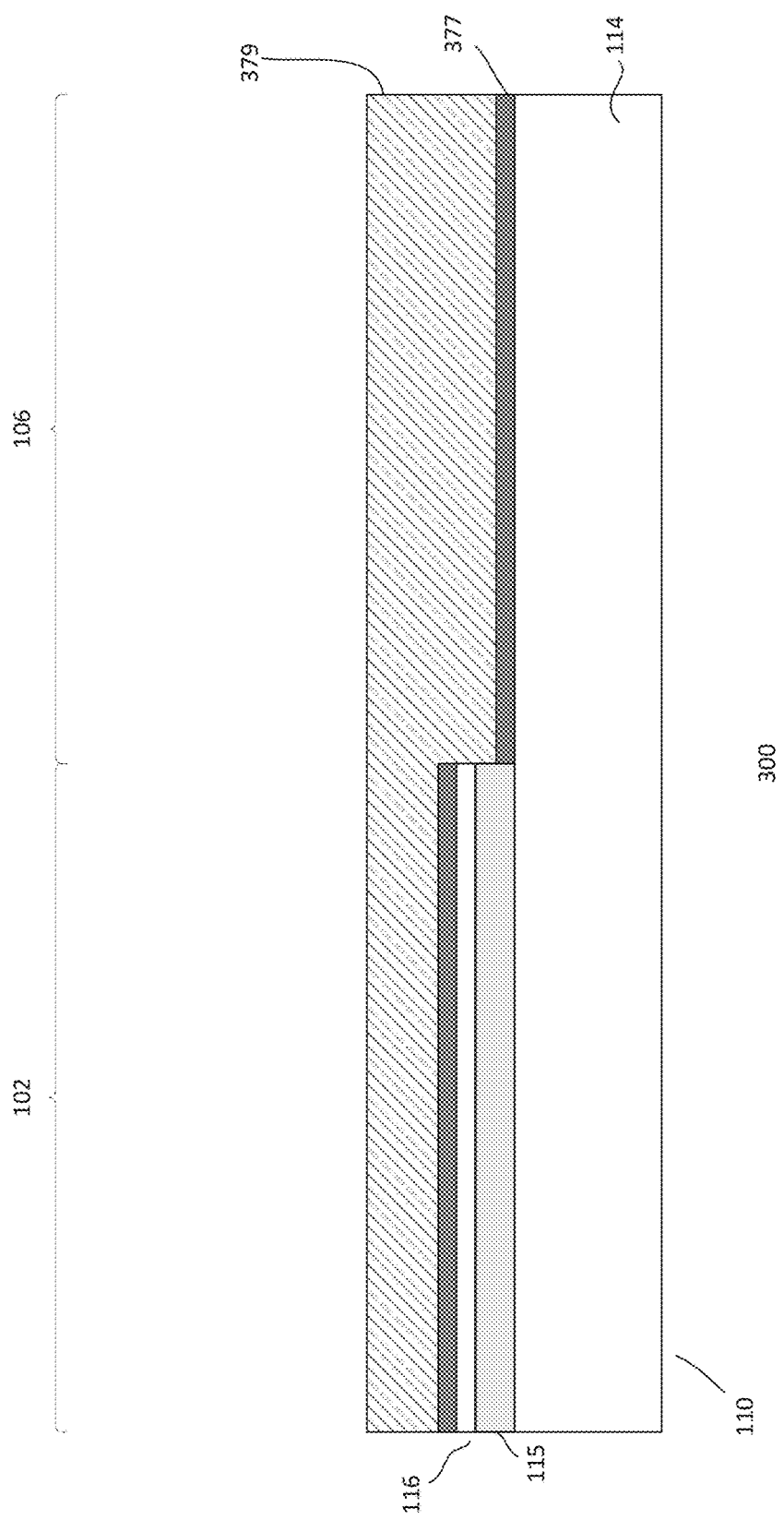

As shown in FIG. 3c, a hard mask is formed on the substrate. The hard mask may be a dielectric hard mask. In one embodiment, the hard mask includes a hard mask stack having multiple mask layers. In one embodiment, the hard mask includes a pad oxide layer 377 and a pad nitride layer 379. The pad oxide layer may be a thermal silicon oxide layer and the pad nitride layer may be a silicon nitride layer formed by chemical vapor deposition (CVD). Other types of hard masks and forming techniques may also be useful. The hard mask sufficiently fills the recess of the hybrid region in the substrate. After forming the hard mask, a planarization process is performed to provide a planar top surface. The pad nitride layer may be planarized by, for example, chemical mechanical polishing (CMP). The final hard mask thickness should be sufficient to serve as an etch mask for a subsequent etch process. The thickness of the pad oxide may be about 100 angstrom while the thickness of the pad nitride in the SOI region is about 1000 angstrom. Other thicknesses may also be useful.

Figure 3D:
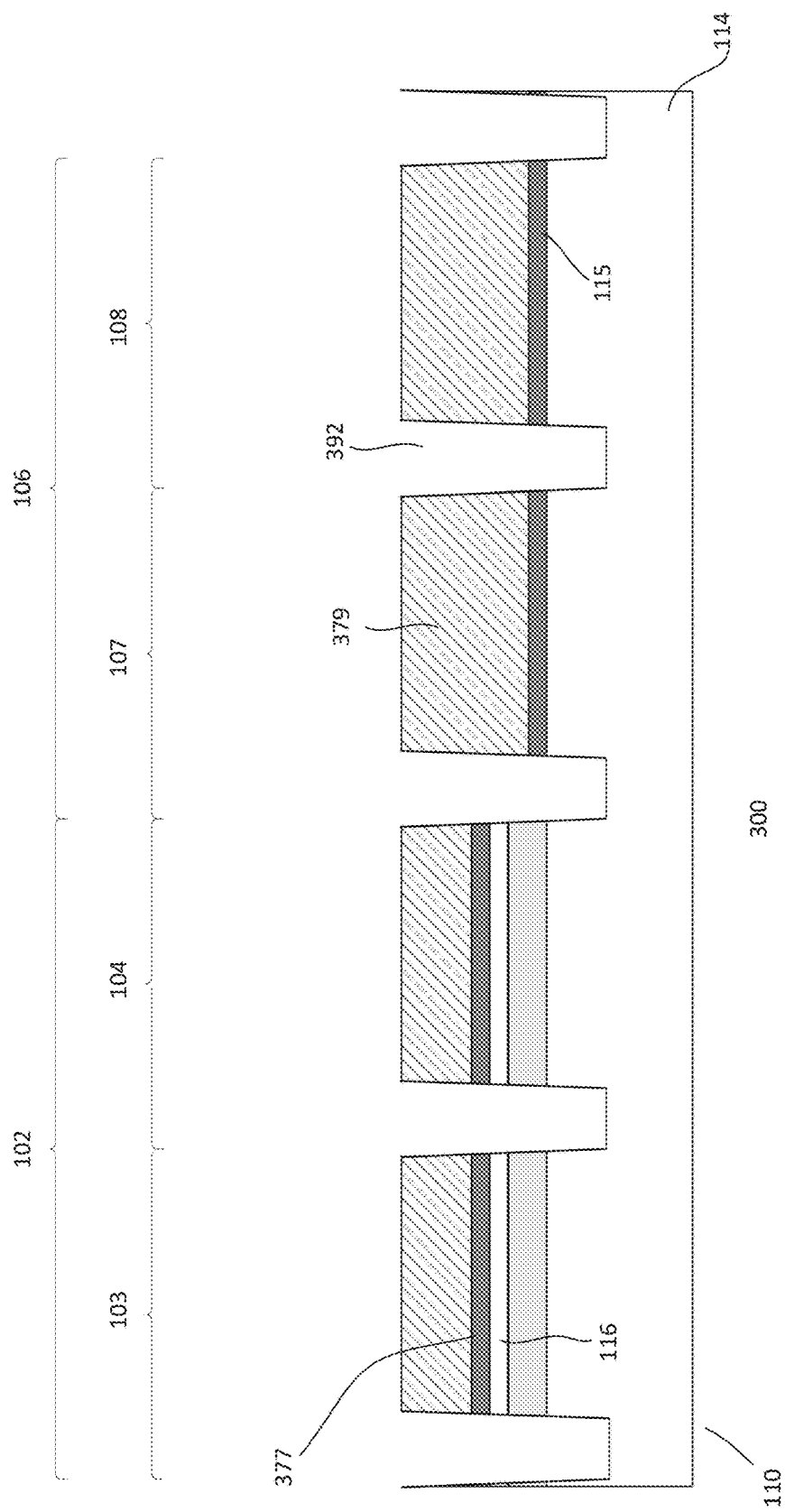

Referring to FIG. 3d, the process proceeds to define different device regions in the SOI and hybrid regions. In one embodiment, the substrate is processed to define first and second SOI secondary regions 103 and 104 in the SOI region and first and second hybrid secondary regions 107 and 108 in the hybrid region. The first SOI secondary region may serve as a logic region, the second SOI secondary region may serve as a RF region, the first hybrid region may serve as a NVM region and the second hybrid region may serve as a HV region. Defining other regions on the substrate may also be useful.

As shown, the process includes forming isolation trenches 392 in the substrate. An isolation trench surrounds a device region. For example, isolation trenches are formed to surround the various secondary regions in the SOI and hybrid regions. The isolation trenches may be formed by mask and etch techniques. For example, a resist mask is employed to etch the hard mask. The hard mask serves as an etch mask for forming the trenches in the SOI and hybrid secondary regions. The depth of the isolation trenches should be sufficient to provide isolation for the hybrid device regions. In one embodiment, a depth of the trenches extends about 200 nm into the bulk substrate. Other depths may also be useful. It is also understood that the isolation trenches in different regions may have different depths. To form different depth trenches, different patterning processes may be employed.

Figure 3E:
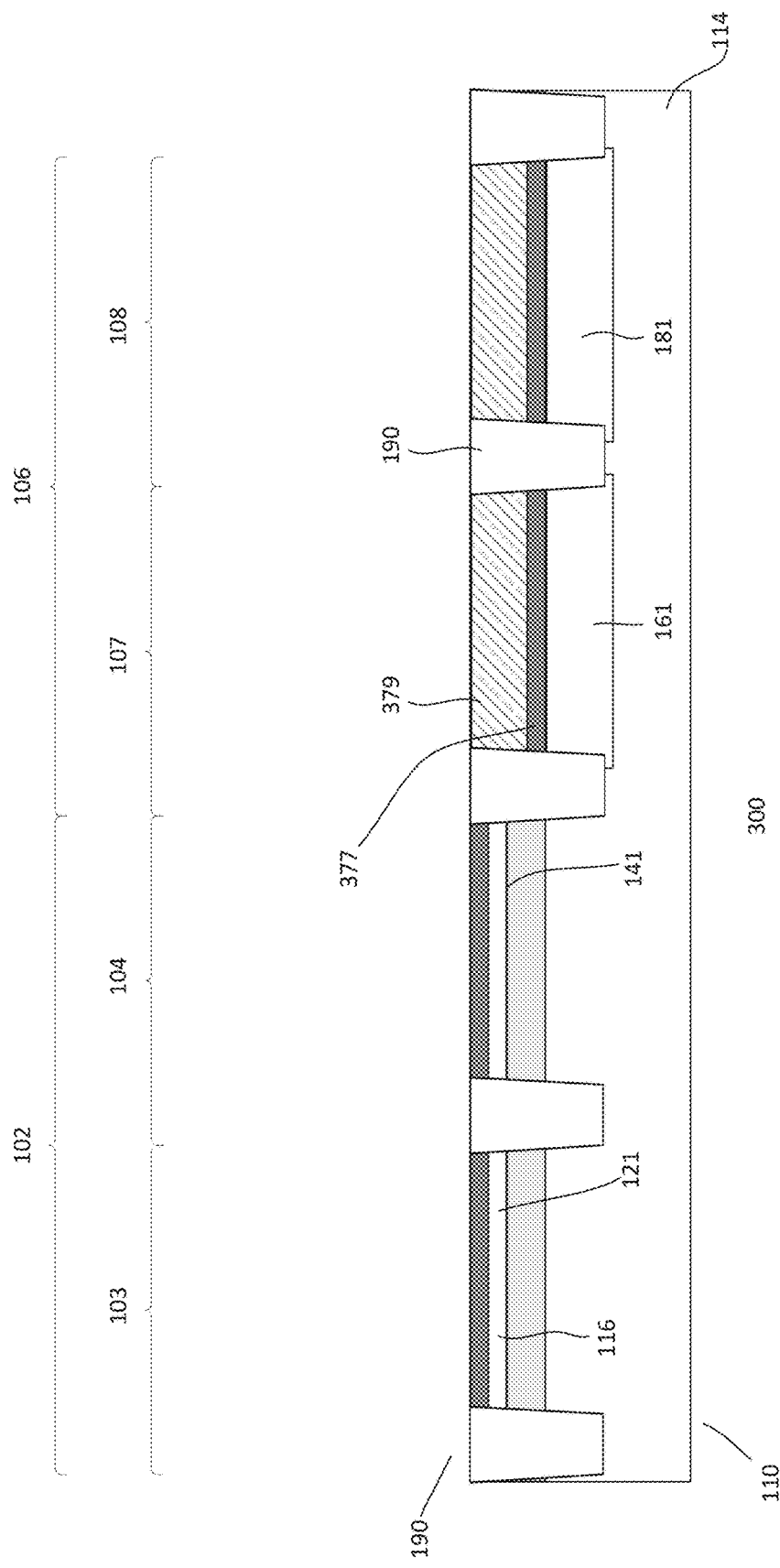

In FIG. 3e, an isolation fill layer is formed on the substrate. The isolation fill layer may be silicon oxide. The isolation fill layer may be formed by various techniques, such as CVD. The isolation fill layer may be a high density plasma (HDP) oxide or a high aspect ratio plasma (HARP) oxide. Other types of isolation fill layers may also be useful. The isolation fill layer sufficiently fills the trenches and covers the substrate. A planarization process, such as CMP, may be performed to remove excess isolation fill material. The CMP produces a planar top surface with the hard mask.

The different device regions may be processed to form doped wells. In one embodiment, a logic well 121 is formed in the surface substrate in the logic region, a RF well 141 is formed in the surface substrate in the RF region, a NVM well 161 is formed in the bulk substrate in the NVM region and a HV well 181 is formed in bulk substrate in the HV region.

The doped wells may be lightly or intermediately doped with second polarity type dopants for first polarity type transistors. Other dopant concentrations may also be useful. The doped wells may be formed by selectively implanting second polarity type dopants into the substrate. Selectively implanting the dopants may be achieved using an implant mask, such as a patterned photoresist layer. The patterned resist mask includes openings to expose the regions of the substrate in which the doped wells are formed. In some instances, deep isolation wells may be provided for the hybrid device regions. The deep isolation wells isolate the hybrid device regions from the substrate. The deep isolation wells have depth deeper than the device wells, such as the NVM well and HV wells. It is understood that the different wells need not to have the same dopant concentration, depths or dopant type. Separate implants may be performed for different dopant types, dopant concentrations, and depths.

Figure 3F:
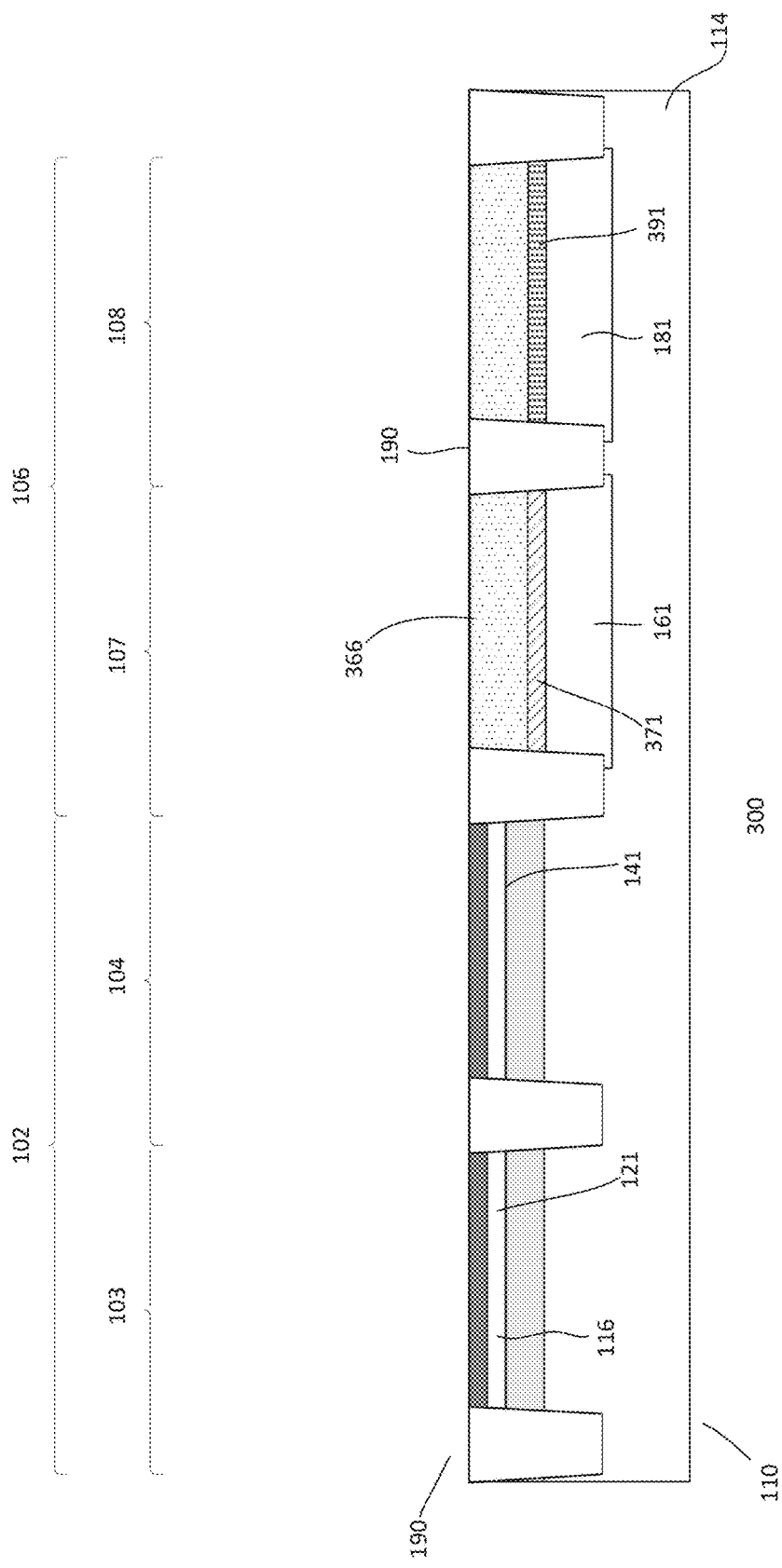

Referring to FIG. 3f, the hard mask in the hybrid regions is selectively removed. For example, the pad nitride and pad oxide layers in the NVM and HV regions are removed while leaving them in the logic and RF regions. Selective removal of the hard mask from the hybrid regions may be achieved by a wet etch using an etch mask protecting the SOI regions. Other techniques, such as RIE, may also be useful.

After removal of the hard mask, the bulk substrate in the hybrid secondary regions is exposed. In one embodiment, the process proceeds to form a FG gate dielectric layer 371 in the NVM region and a HV gate dielectric layer 391 in the HV region. The dielectric layers may be silicon oxide layers formed by thermal oxidation. The dielectric layers may be formed in a single thermal process. For example, thermal oxidation is performed to form the dielectric layers in the NVM and HV regions.

In the case that the FG dielectric and HV dielectric layers have different thicknesses, the dielectric layer is formed to the thickness of the thicker dielectric layer. An etch process may be performed to selectively thin the thinner dielectric layer to the desired thickness. For example, in the case the HV gate dielectric layer is thicker than the FG dielectric layer, the thermal oxidation process forms HV and FG dielectric layers to the thickness of the HV gate dielectric layer. The FG dielectric layer is then selectively thinned by, for example, a wet etch to the desired thickness.

After forming the gate dielectric layers in the hybrid regions, a first gate electrode layer 366 is formed on the substrate. The first gate electrode layer, for example, may be a polysilicon layer formed by CVD. The gate electrode layer may be a doped gate electrode layer. Doping the gate electrode layer may be achieved by in-situ doping or by ion implantation. Other types of gate electrode layers may also be useful. The gate electrode layer sufficiently fills the openings in the hybrid regions and covers the substrate. Excess gate electrode material may be removed by, for example, CMP. The CMP produces a planar top surface with the STI, hard mask and first gate electrode layer in the hybrid regions.

Figure 3G:
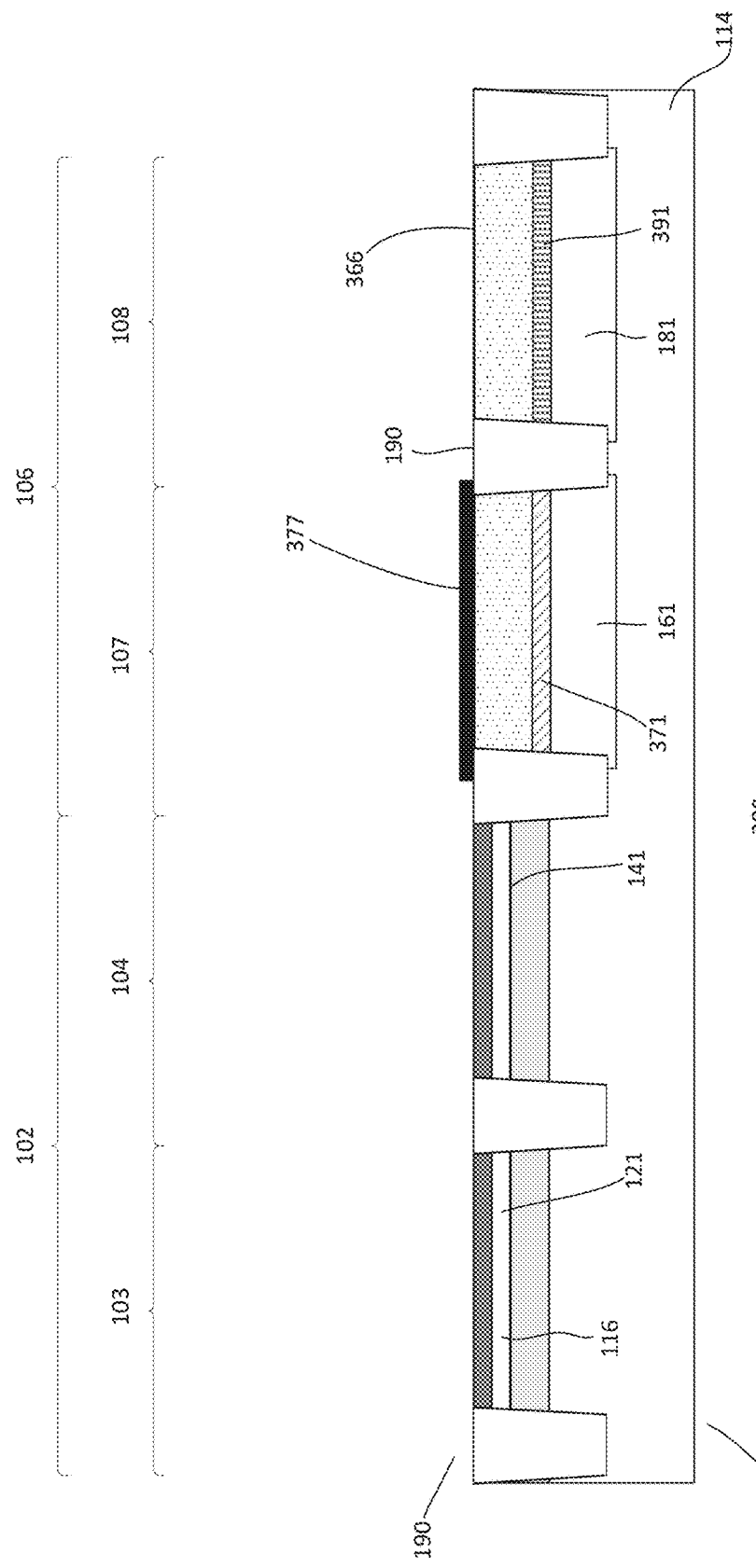

Referring to FIG. 3g, a dielectric charge trapping layer 377 is formed on the surface of the first gate electrode layer in the NVM region. The charge trapping layer, for example, may be a dielectric stack having multiple dielectric layers. In one embodiment, the charge trapping layer includes an ONO stack. Providing other types of charge trapping layers, including a single or multiple layered stack, may also be useful. The ONO stack may be formed by, for example, CVD. Forming the charge trapping layer by other processes or techniques may also be useful. In one embodiment, a blanket charge trapping layer is formed, covering the various regions of the substrate. The blanket charge trapping layer is patterned by, for example, mask and etch techniques, leaving it on the surface of the first gate electrode layer in the NVM region.

Figure 3H:
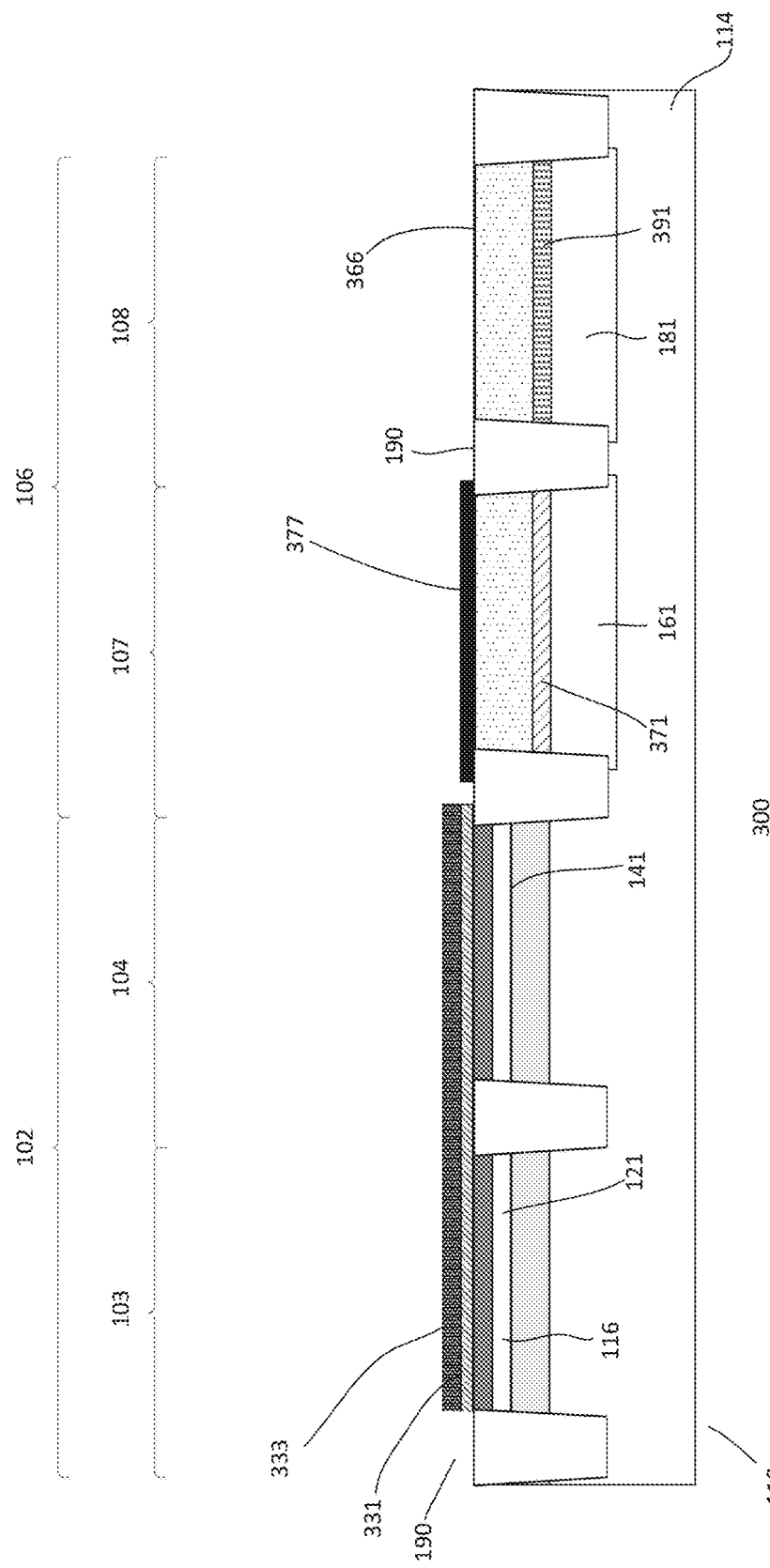

The gate layers of a metal gate, as shown in FIG. 3h, may be formed on the surface of the surface substrate in the SOI region. The gate layers, for example, include a SOI gate dielectric layer 331 and a first SOI gate electrode layer 333. In one embodiment, the SOI gate dielectric layer and first SOI gate electrode layer are gate layers of a high k metal gate. For example, the SOI gate dielectric layer may be a high k dielectric layer, such as $HfO_2$ layer while the SOI first gate electrode layer may be a TiN layer. Providing other types of SOI gate layers may also be useful. The SOI gate dielectric and SOI gate electrode layers may be formed by, for example, physical vapor deposition (PVD) or sputtering. Other techniques for forming the SOI gate layers may also be useful.

Figure 3I:
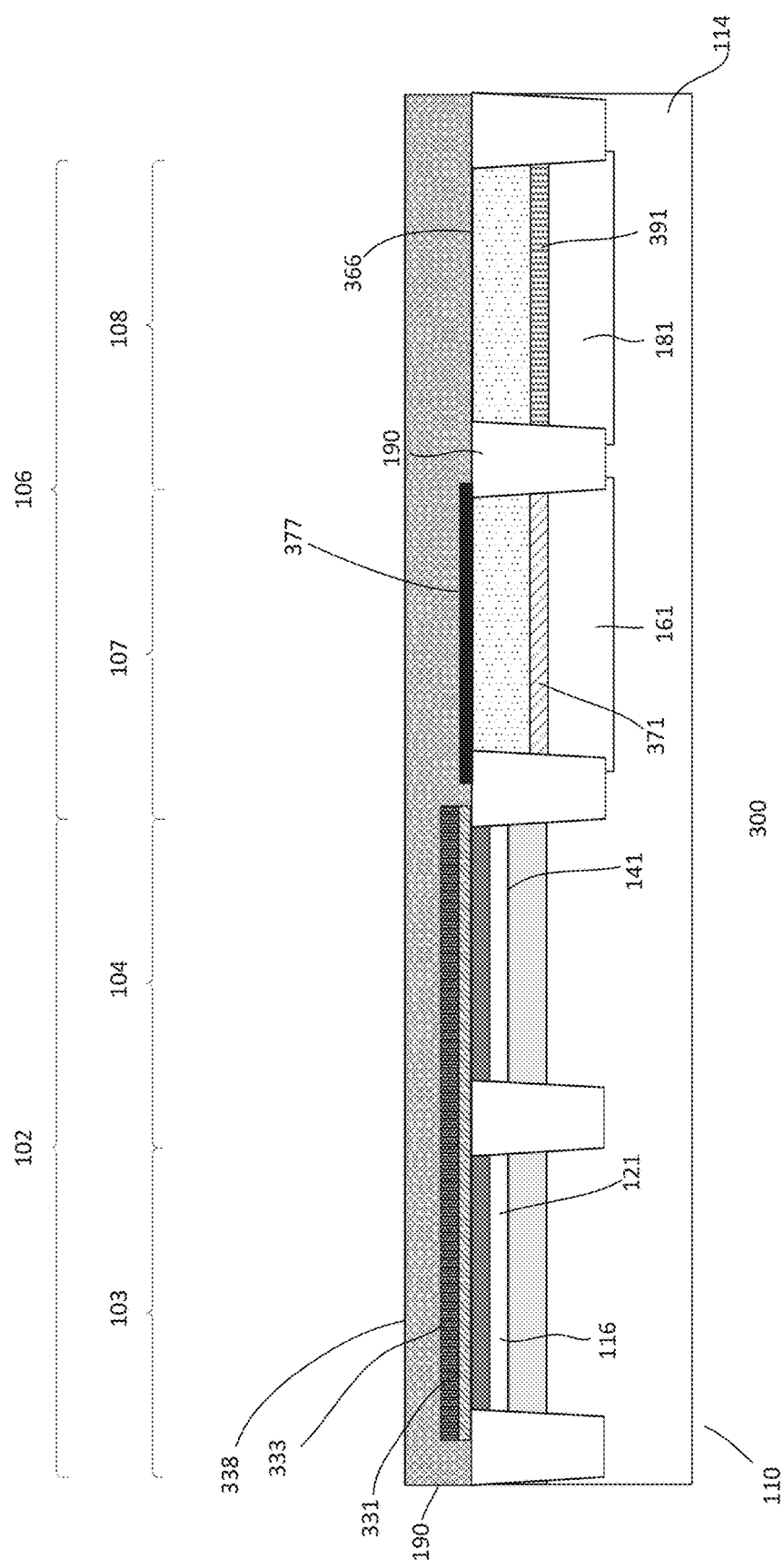

Referring to FIG. 3i, an upper or second gate electrode layer 338 is formed on the substrate. The upper gate electrode layer, for example, may be a polysilicon layer formed by CVD. The gate electrode layer may be a doped gate electrode layer. Doping the gate electrode layer may be achieved by in-situ doping or by ion implantation. Other types of gate electrode layers may also be useful. The gate electrode layer is a blanket gate electrode layer. For example, the gate electrode layer covers the high k metal gate layers in the SOI regions, the charge trapping layer in the NVM region and the first gate electrode layer in the HV region. A polishing process, such as CMP, may be performed to planarize the top surface of the second gate electrode layer.

Figure 3J:
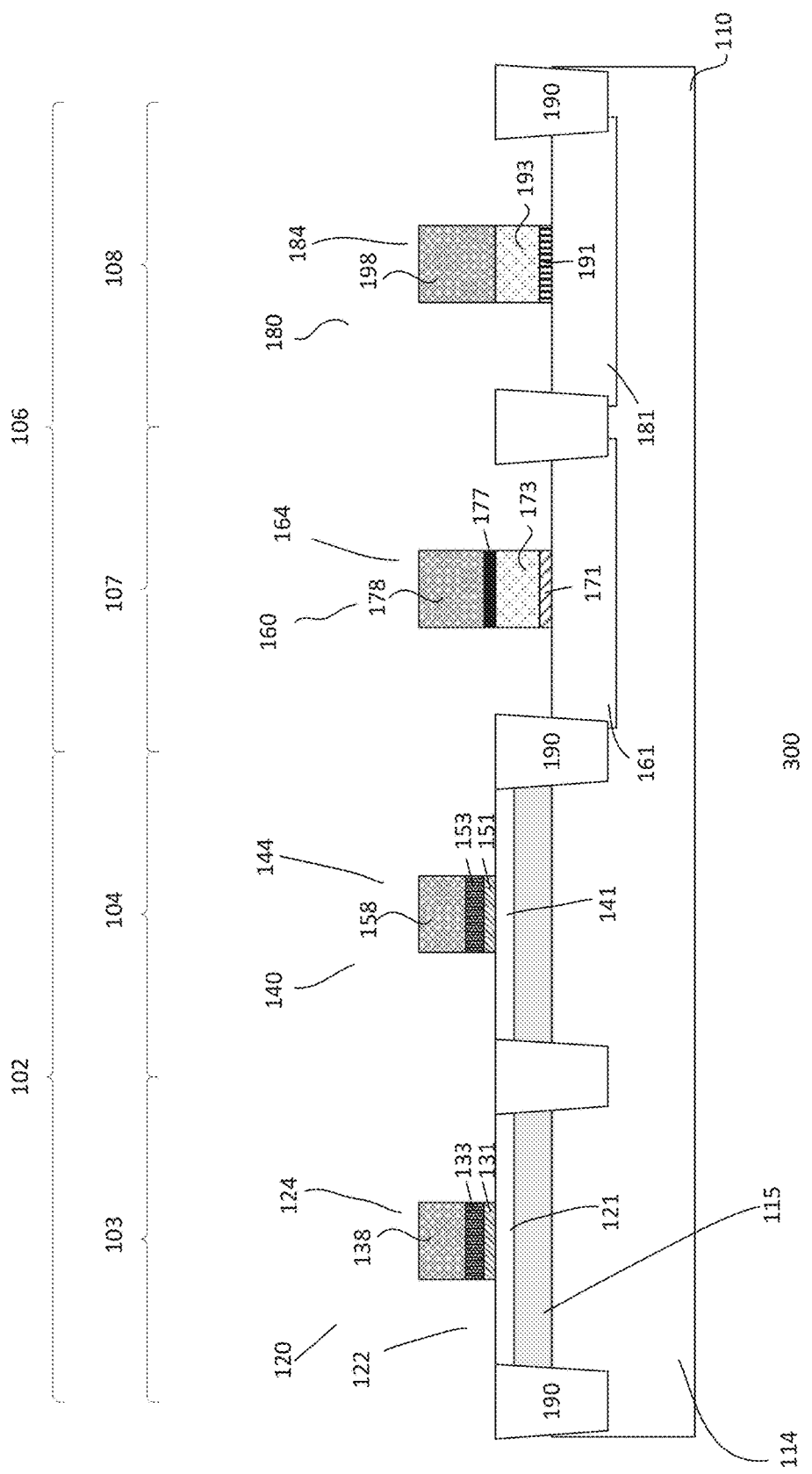

In FIG. 3j, the gate layers of the various regions are patterned to form gates. In one embodiment, the gate layers are patterned to form a logic gate 124 in the logic region, a RF gate 144 in the RF region, a NVM gate 164 in the NVM region and a HV gate 184 in the HV region. Patterning the gate layers may be achieved using mask and etch techniques. For example, a resist mask may be used to serve as an etch mask for a RIE etch to form the gates. Alternatively, a hard mask, such as a silicon oxide hard mask, may be employed. In the case of a hard mask, it is first patterned by a resist layer and subsequently transferring the pattern of the hard mask to the gate layers. In one embodiment, the gate layers in the various regions of the substrate may be patterned simultaneously. Patterning the gate layers in the hybrid region and SOI region separately may also be useful.

As shown, the logic gate includes a high k logic gate dielectric 131, a metal logic gate electrode 133 and a polysilicon logic electrode 138. The RF gate includes a high k RF gate dielectric 151, a metal RF gate electrode 153 and a polysilicon RF gate electrode 158. As for the NVM gate, it includes a thermal oxide NVM gate dielectric 171, a polysilicon FG electrode 173, a charge trapping NVM dielectric 177 and a polysilicon CG electrode 178. The HV gate includes a HV gate dielectric 191 and first and second HV gate electrodes 193 and 198 which are shorted together. As discussed, the gates of the different regions have coplanar top surfaces. For example, the top surfaces of the gates of the different regions are defined by the polysilicon upper gate electrode layer.

Figure 3K:
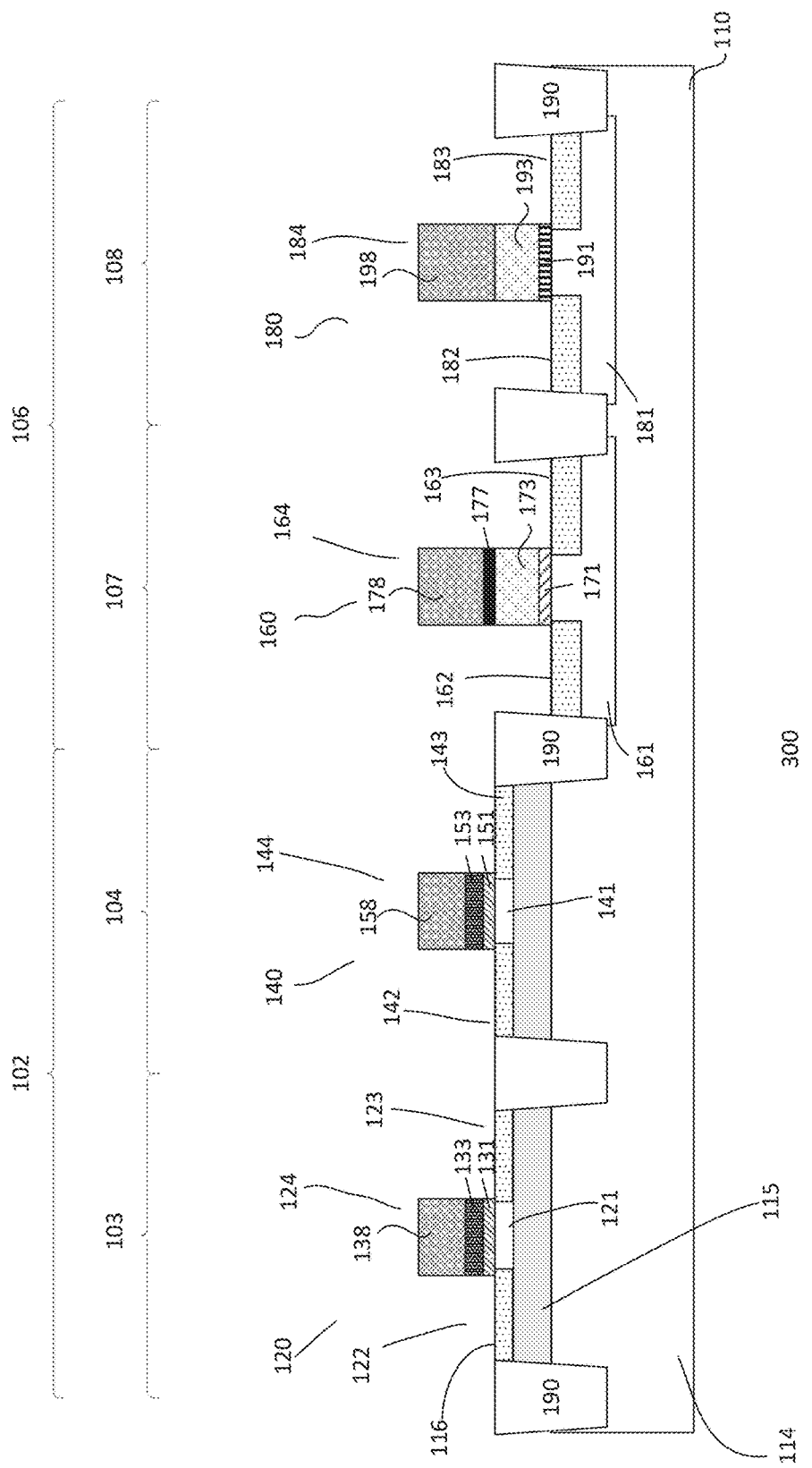

Referring to FIG. 3k, the process continues to form S/D regions for the different transistors in the different regions. In one embodiment, logic S/D regions 122 and 123 are formed in surface substrate in the logic region, RF S/D regions 142 and 143 are formed in the surface substrate in the RF region, NVM S/D regions 162 and 163 are formed in the bulk substrate in the NVM region and HV S/D regions 182 and 183 are formed in the bulk substrate in the HV region. The S/D regions may be heavily doped S/D regions doped with first polarity type dopants for first polarity type devices. The S/D regions may be formed by ion implantation using an implant mask, such as a resist mask, which exposed the device regions where S/D regions are formed. The S/D regions of the various device regions may be formed in the same implant process. It is understood that the S/D regions of different regions may have different dopant concentrations, dopant types or depths. In such cases, separate implant processes may be employed.

In some embodiments, lightly doped extension regions may be formed in the S/D regions. The lightly doped extension regions may extend below the gate. To facilitate forming lightly doped extension regions in the S/D regions, dielectric sidewall spacers may be formed. For example, an implant may be performed to form the extension regions, followed by forming spacers on sidewalls of the gates. Another implant may be performed to form the heavily doped S/D regions. The heavily doped S/D regions, for example, may be aligned to the gate sidewall spacers.

The process may continue to form a BEOL dielectric which includes multiple interconnect levels with metal interconnects and via contacts for interconnecting the different transistors and components of the device. Oher processes may be performed to complete the device.

FIGS. 4a-4d show cross-sectional views of another embodiment of a process 400 for forming a device. The device, for example, is similar to that described in FIGS. 1-2.

In addition, the process is similar to that described in FIGS. 3a-3k. Common elements may not be described or described in detail.

Figure 4A:
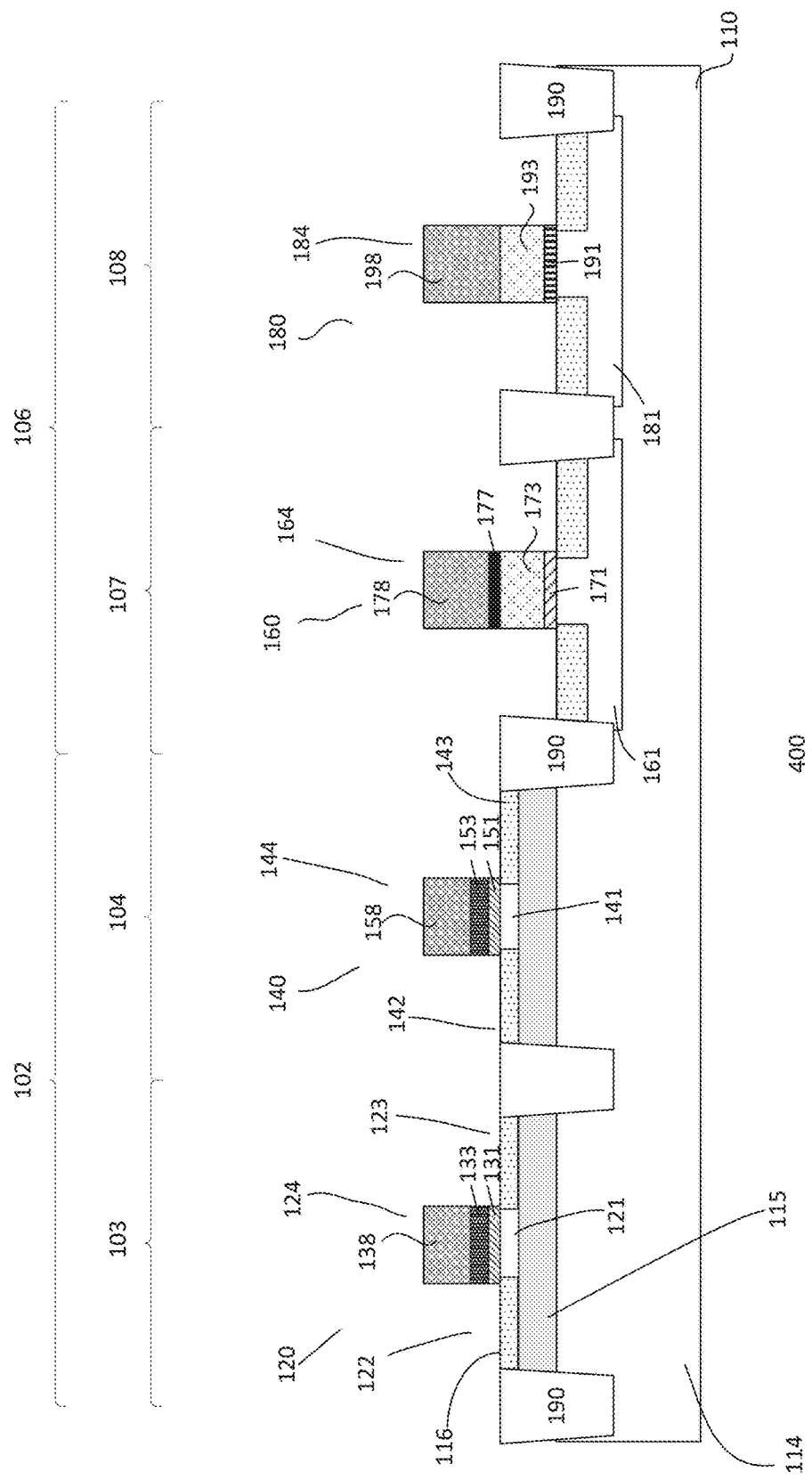
FIGS. 4a-4d show cross-sectional views of a process for forming another embodiment of an eNVM device.

Referring to FIG. 4a, the process is at the stage of processing as described in FIG. 3k. For example, the substrate is processed to form a logic transistor 120 in a logic region, a RF transistor 140 in a RF region, a NVM transistor 160 in a NVM region and a HV transistor 180 in a HV region.

Figure 4B:
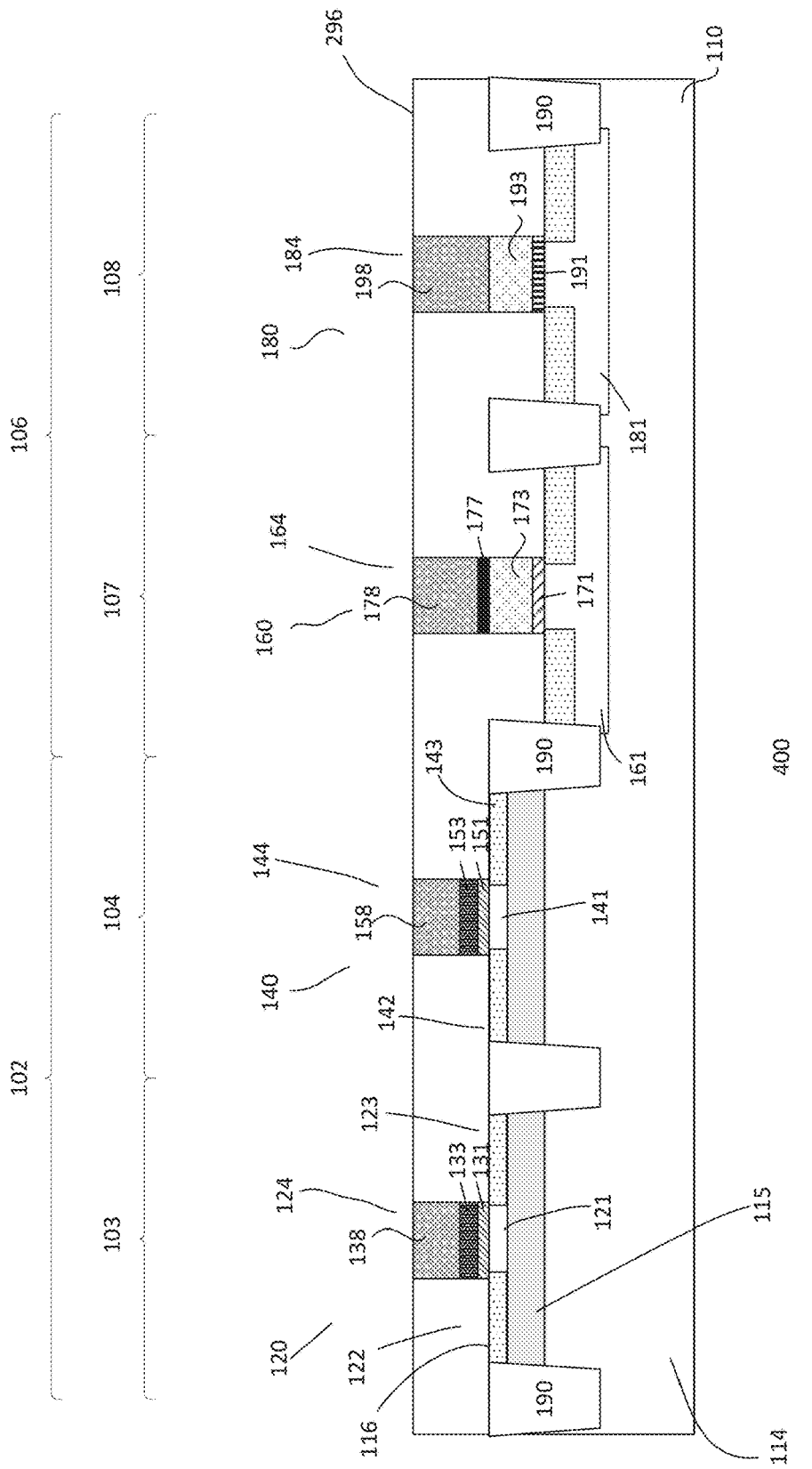

As shown in FIG. 4b, a dielectric layer 296 is formed on the substrate. The dielectric layer, for example, may be a part of a BEOL dielectric layer. The dielectric layer may be a silicon oxide layer formed by, for example, CVD. Other types of dielectric layers or forming techniques may also be useful. The dielectric layer sufficiently fills the gaps between the transistors of the different regions as well as covering the gates. A polishing process, such as CMP, is performed to remove excess dielectric layer and to produce a planar top surface between the gates and dielectric layer. For example, the CMP exposes the tops of the gates. In the case that a hard mask is used to pattern the gates, the CMP also removes the hard mask to expose the tops of the gates.

Figure 4C:
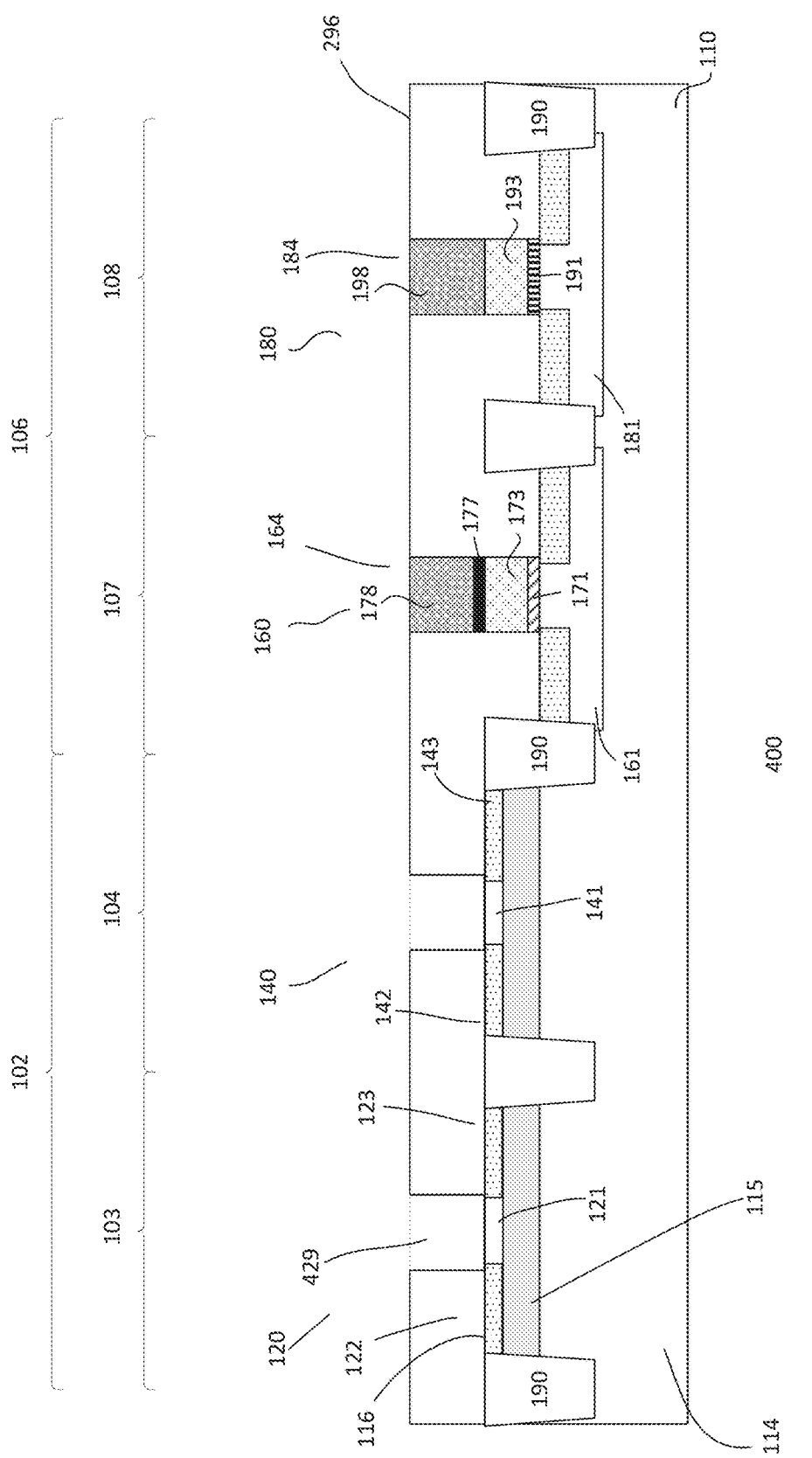

Referring to FIG. 4c, the SOI gates, such as the logic and RF gates, are selectively removed. Removing the gates may be performed using mask and etch techniques. For example, a mask may be provided which exposes the gates in the SOI region and an etch, such as RIE, is performed to remove the exposed gates. Other techniques for removing the gates may also be useful. Removing the gates results in gate trenches 429 in the dielectric layer where the SOI gates previously occupied. After removing the gates, the mask is removed by, for example, ashing.

Figure 4D:
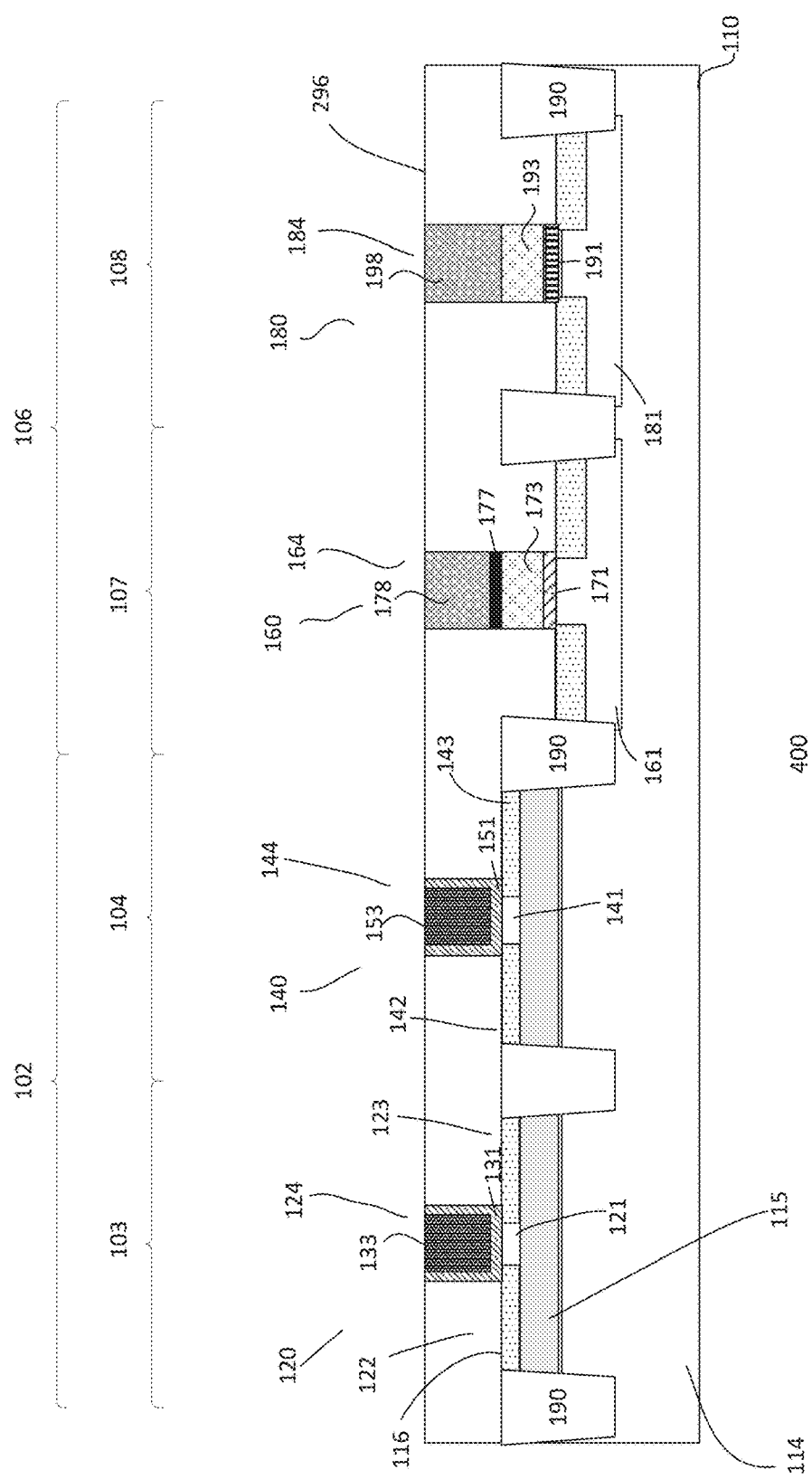

In FIG. 4d, gate layers of a gate may be formed on the substrate. In one embodiment, the gate layers are layers of a metal gate. Forming gate layers of other types of gates may also be useful. The gate layers of a metal gate, for example, may include a high k dielectric layer and a metal gate electrode layer.

In one embodiment, a high k dielectric layer 131 and 151 is formed on the substrate. The dielectric layer may line the gate trenches and the surface of the dielectric layer and gates in the hybrid region. The high k dielectric layer may be a $HfO_2$ layer. Other types of high k dielectric layers may also be useful. A metal gate electrode layer 133 and 153 is formed on the substrate. The metal gate electrode layer fills the trench openings and dielectric layer lined with the gate dielectric layer. The metal gate electrode, for example, may be a TiN layer. Providing other types of metal gate electrode layers may also be useful. The metal gate layers may be formed by, for example, PVD or sputtering. Other techniques for forming the metal gate layers may also be useful.

Excess material of the metal gate layers is removed. In one embodiment, a polishing process, such as CMP, is performed to remove excess metal gate layers on the surface of the dielectric layer and to produce a planar top surface between the gates and dielectric layer. For example, the CMP exposes the tops of the gates.

The process may continue to form the remaining portions of the BEOL dielectric which includes multiple interconnect levels with metal interconnects and via contacts for interconnecting the different transistors and components of the device. Other processes may be performed to complete the device.

The present disclosure may be embodied in other specific forms without departing from the spirit or essential characteristics thereof. The foregoing embodiments, therefore, are to be considered in all respects illustrative rather than limiting the present disclosure described herein. Scope of the present disclosure is thus indicated by the appended claims, rather than by the foregoing description, and all changes that come within the meaning and range of equivalency of the claims are intended to be embraced therein.

The invention claimed is:

1. A method for fabricating a semiconductor device comprising:
   providing a crystal-on-insulator (COI) substrate, the COI substrate includes
      a surface substrate,
      a bulk substrate, and
      a buried oxide (BOX) layer disposed between the surface and bulk substrates;
   defining a COI region on the COI substrate, wherein the COI region includes the surface substrate, the BOX layer and the bulk substrate;
   defining a hybrid region on the COI substrate, wherein defining the hybrid region comprises
      removing the surface substrate in the hybrid region, and
      removing the BOX layer in the hybrid region to expose the bulk substrate in the hybrid region;
   forming a non-volatile memory (NVM) transistor in a NVM region defined in the hybrid region of the COI substrate, the NVM transistor includes a NVM gate on the bulk substrate between first and second NVM source/drain (S/D) regions;
   forming a logic transistor in a logic region defined in the COI region of the COI substrate, the logic transistor includes a logic gate on the surface substrate between first and second logic S/D regions;
   forming a radio frequency (RF) transistor in a RF region defined in the COI region, the RF transistor includes a RF gate on the bulk substrate between first and second RF S/D regions; and
   wherein forming the NVM, RF and logic transistors include forming the NVM gate, the RF gate and the logic gate having about coplanar top NVM, RF and logic gate surfaces.

2. The method of claim 1 wherein the hybrid region compensates for differences in heights of the NVM and logic transistors to produce the about coplanar top NVM and logic gate surfaces.

3. The method of claim 1 wherein forming the NVM and logic gates comprises:
   forming gate layers of the NVM and logic gates, wherein forming the gate layers include,
      forming layers of a lower portion of the NVM gate in the NVM region comprising,
         forming a floating gate (FG) dielectric layer on a top surface of the bulk substrate in the NVM region of the hybrid region,
         forming a first gate electrode layer over the FG gate dielectric layer,
         performing a planarization process to remove excess first gate electrode layer to form a first gate electrode layer having a coplanar top surface with a top surface of the surface substrate, and
         forming a control gate (CG) dielectric layer over the first gate electrode layer in the NVM region;
      forming layers of the logic gate comprising
         forming a logic gate dielectric on the surface substrate in the logic region of the COI region, and
         forming a blanket second gate electrode layer on the COI substrate covering the logic and NVM regions; and patterning the gate layers to form the NVM gate in the NVM region and the logic gate in the logic region.

4. The method of claim 3 wherein forming the logic gate comprises forming layers of a metal logic gate which includes,
   forming the logic gate dielectric in the logic region, the logic gate dielectric comprising a high k logic gate dielectric,
   forming a first logic gate electrode layer in the logic region, the first logic gate electrode layer comprising a metal gate electrode layer, and
   forming the blanket second gate electrode layer on the substrate covering the logic gate dielectric and first logic gate electrode in the logic region and the CG dielectric in the NVM region.

5. The method of claim 3 wherein the CG dielectric layer comprises a charge trapping CG dielectric layer.

6. The method of claim 3 wherein the CG dielectric layer comprises an oxide/nitride/oxide CG dielectric layer.

7. The method of claim 1 wherein forming the NVM gate comprises forming a floating gate (FG) below a control gate (CG), wherein a top of the FG is about coplanar with a top surface of the surface substrate.

8. The method of claim 1 wherein forming the NVM, RF and logic gates comprises:
   forming gate layers of the NVM and logic gates, wherein forming the gate layers include,
      forming layers of a lower portion of the NVM gate in the NVM region comprising,
      forming a floating gate (FG) dielectric layer on a top surface of the bulk substrate in the NVM region of the hybrid region,
      forming a FG electrode layer over the FG gate dielectric layer,
      planarizing the substrate surface to remove excess FG electrode layer to form a FG electrode layer having a coplanar top surface with a top surface of the surface substrate, and
      forming a control gate (CG) dielectric layer over the FG electrode layer in the NVM region;
   forming layers of the logic gate and the RF gate comprising
      forming a logic gate dielectric and a RF gate dielectric on the surface substrate in the logic region and RF region of the COI region, and
      forming a blanket second gate electrode layer on the COI substrate covering the logic, RF and NVM regions; and
   patterning the gate layers to form the NVM gate in the NVM region, the RF gate in the RF region and the logic gate in the logic region.

9. The method of claim 1 comprises:
   forming a high voltage (HV) transistor in a HV region defined in the hybrid region of the substrate, the HV transistor includes a HV gate on the bulk substrate between first and second HV S/D regions; and
   wherein forming the NVM, HV RF and logic transistors include forming the NVM gate, the HV gate, the RF gate and the logic gate having about coplanar top NVM, HV, RF and logic gate surfaces.

10. The method of claim 9 wherein forming the NVM, HV and logic gates comprises:
    forming gate layers of the NVM and logic gates, wherein forming the gate layers include,
       forming layers of a lower portion of the NVM gate in the NVM region and a lower portion of the HV gate in the HV region comprising,
       forming a floating gate (FG) dielectric layer on a top surface of the bulk substrate in the NVM region of the hybrid region,
       forming a HV gate dielectric layer on the top surface of the bulk substrate in the HV region of the hybrid region,
       forming a first gate electrode layer over the FG gate dielectric layer and the HV gate dielectric layer,
       performing a planarization process to remove excess first gate electrode layer to form a first gate electrode layer having a coplanar top surface with a top surface of the surface substrate in the COI region, and
       forming a control gate (CG) dielectric layer over the first gate electrode layer in the NVM region;
    forming layers of the logic gate comprising
       forming a logic gate dielectric on the surface substrate in the logic region of the COI region, and
       forming a blanket second gate electrode layer on the COI substrate covering the logic, HV and NVM regions; and
    patterning the gate layers to form the NVM gate in the NVM region, the HV gate in the HV region and the logic gate in the logic region.

11. A semiconductor device comprising:
    a crystal-on-insulator (COI) substrate, the COI substrate includes
       a surface substrate,
       a bulk substrate, and
       a buried oxide (BOX) layer disposed between the surface and bulk substrates;
    a COI region on the COI substrate, wherein the COI region of the substrate includes the surface substrate, the BOX layer and the bulk substrate;
    a hybrid region on the COI substrate, wherein the hybrid region comprises the bulk substrate without the surface substrate and BOX layer;
    a non-volatile memory (NVM) transistor in a NVM region defined in the hybrid region of the COI substrate, the NVM transistor includes a NVM gate disposed on the bulk substrate between first and second NVM source/drain (S/D) regions;
    a logic transistor in a logic region defined in the COI region of the COI substrate, the logic transistor includes a logic gate disposed on the surface substrate between first and second logic S/D region;
    a radio frequency (RF) transistor in a RF region defined in the COI region, the RF transistor includes a RF gate disposed on the bulk substrate between first and second RF S/D regions; and
    wherein the NVM, RF and logic gates comprise about coplanar top NVM, RF and logic gate surfaces.

12. The device of claim 11 wherein the NVM gate comprises a floating gate (FG) below a control gate (CG), wherein a top planar surface of the FG is about coplanar with a top planar surface of the surface substrate in the COI region.

13. The device of claim 11 wherein:
    the RF gate comprises a RF high k metal gate;
    the logic gate comprises a logic high k metal gate; and
    the NVM gate comprises a floating gate (FG) below a control gate (CG), wherein
       the FG comprises
          a FG dielectric is disposed on the bulk substrate, and
          a FG electrode disposed on the FG dielectric, and
       the CG comprises
          a CG dielectric disposed on the FG electrode, and
          a CG electrode disposed on the CG dielectric.

14. The device of claim 13 wherein the RF gate, the logic gate and the NVM gate comprises a gate first RF gate, a gate first logic gate and a gate first NVM gate, wherein:
the gate first RF gate comprises
a high k RF gate dielectric,
a RF metal gate disposed on the high k RF gate dielectric, and a polysilicon RF gate electrode disposed on the RF metal gate electrode,
the gate first logic gate comprises
a high k logic gate dielectric,
a logic metal gate disposed on the high k logic gate dielectric, and
a polysilicon logic gate electrode disposed on the logic metal gate electrode; and
the gate first NVM gate comprises
a FG dielectric disposed on the bulk substrate,
a FG electrode disposed on the FG dielectric,
a CG dielectric disposed on the FG dielectric, and
a CG electrode disposed on the CG dielectric.

15. The device of claim 13 wherein the RF gate, the logic gate and the NVM gate comprises a gate last RF gate, a gate last logic gate and a gate first NVM gate, wherein:
the gate last RF gate comprises
a high k RF gate dielectric, and
a RF metal gate disposed on the high k RF gate dielectric, wherein the high k RF gate dielectric surrounds sidewalls and a bottom of the RF metal gate;
the gate last logic gate comprises
a high k logic gate dielectric, and
a logic metal gate disposed on the high k logic gate dielectric, wherein the high k logic gate dielectric surrounds sidewalls and a bottom of the logic metal gate; and
the gate first NVM gate comprises
a FG dielectric disposed on the bulk substrate,
a FG electrode disposed on the FG dielectric,
a CG dielectric disposed on the FG dielectric, and
a CG electrode disposed on the CG dielectric.

16. The device of claim 12 comprises:
a high voltage (HV) transistor in a HV region defined in the hybrid region of the substrate, the HV transistor includes a HV gate on the bulk substrate between first and second HV S/D regions; and
wherein NVM, HV, RF and logic gates comprise about coplanar top NVM, HV, RF and logic gate surfaces.

17. The device of claim 16 wherein:
the RF gate comprises a RF high k metal gate;
the logic gate comprises a logic high k metal gate;
the NVM gate comprises a floating gate (FG) below a control gate (CG), wherein
the FG comprises
a FG dielectric is disposed on the bulk substrate, and
a FG electrode disposed on the FG dielectric, and
the CG comprises
a CG dielectric disposed on the FG electrode, and
a CG electrode disposed on the CG dielectric; and
the HV gate comprises
a HV gate dielectric disposed on the bulk substrate,
a first HV gate electrode disposed on the HV gate dielectric, and
a second HV gate electrode disposed on the first HV gate electrode.

18. A method for fabricating a semiconductor device comprising:
providing a crystal-on-insulator (COI) substrate, the COI substrate includes
a surface substrate,
a bulk substrate, and
a buried oxide (BOX) layer disposed between the surface and bulk substrates;
defining a COI region on the COI substrate, wherein the COI region includes the surface substrate, the BOX layer and the bulk substrate;
defining a hybrid region on the COI substrate, wherein defining the hybrid region comprises
removing the surface substrate in the hybrid region, and
removing the BOX layer in the hybrid region to expose the bulk substrate in the hybrid region;
forming a non-volatile memory (NVM) transistor in a NVM region defined in the hybrid region, the NVM transistor includes a NVM gate on the bulk substrate between first and second NVM source/drain (S/D) regions, wherein forming the NVM gate comprises
forming a floating gate (FG) dielectric layer on a top surface of the bulk substrate in the NVM region, and
forming a FG electrode layer over the FG dielectric layer, wherein the FG electrode layer comprises a top planar surface which is coplanar with a top planar surface of the surface substrate in the COI region; and
forming a logic transistor in a logic region defined in the COI region of the COI substrate, the logic transistor includes a logic gate on the surface substrate between first and second logic S/D regions.

19. The method of claim 18 wherein forming the FG electrode layer comprises performing a planarization process to remove excess FG electrode layer material and define the top surface of the FG electrode layer.

20. The method of claim 18 wherein forming the NVM gate comprises:
forming a control gate (CG) dielectric layer over the FG gate electrode layer; and
forming a CG electrode layer over the CG dielectric layer, wherein the CG electrode layer comprises a top planar surface which is about coplanar with a top planar surface of the logic gate.

* * * * *